(12) United States Patent
Zhang et al.

(10) Patent No.: US 11,976,348 B2
(45) Date of Patent: May 7, 2024

(54) CARBIDE TOOL CLEANING AND COATING PRODUCTION LINE AND METHOD

(71) Applicants: QINGDAO UNIVERSITY OF TECHNOLOGY, Shandong (CN); NINGBO SANHAN ALLOY MATERIAL CO., LTD., Zhejiang (CN)

(72) Inventors: Yanbin Zhang, Qingdao (CN); Liang Luo, Qingdao (CN); Lizhi Tang, Qingdao (CN); Changhe Li, Qingdao (CN); Weixi Ji, Qingdao (CN); Binhui Wan, Qingdao (CN); Shuo Yin, Qingdao (CN); Huajun Cao, Qingdao (CN); Bingheng Lu, Shandong (CN); Xin Cui, Qingdao (CN); Mingzheng Liu, Qingdao (CN); Teng Gao, Qingdao (CN); Jie Xu, Qingdao (CN); Huiming Luo, Qingdao (CN); Haizhou Xu, Qingdao (CN); Min Yang, Qingdao (CN); Huaping Hong, Qingdao (CN); Xiaoming Wang, Qingdao (CN); Yuying Yang, Qingdao (CN); Haogang Li, Qingdao (CN); Wuxing Ma, Qingdao (CN); Shuai Chen, Qingdao (CN)

(73) Assignees: QINGDAO UNIVERSITY OF TECHNOLOGY, Qingdao (CN); NINGBO SANHAN ALLOY MATERIAL CO., LTD., Ningbo (CN)

( * ) Notice: Subject to any disclaimer, the term of this patent is extended or adjusted under 35 U.S.C. 154(b) by 410 days.

(21) Appl. No.: 17/340,831

(22) Filed: Jun. 7, 2021

(65) Prior Publication Data
US 2022/0056572 A1 Feb. 24, 2022

(30) Foreign Application Priority Data
Aug. 24, 2020 (CN) .......................... 202010857198.0

(51) Int. Cl.
*C23C 14/02* (2006.01)
*B08B 3/02* (2006.01)
(Continued)

(52) U.S. Cl.
CPC .............. *C23C 14/021* (2013.01); *B08B 3/02* (2013.01); *B08B 3/045* (2013.01); *B08B 3/12* (2013.01); *C23C 14/325* (2013.01); *C23C 14/505* (2013.01)

(58) Field of Classification Search
CPC ... C23C 14/021; C23C 14/325; C23C 14/505; B08B 3/12; B08B 3/02; B08B 3/045
See application file for complete search history.

(56) References Cited

U.S. PATENT DOCUMENTS

| 2022/0055171 A1* | 2/2022 | Yang | B24B 49/12 |
| 2022/0055243 A1* | 2/2022 | Li | B08B 3/102 |

FOREIGN PATENT DOCUMENTS

| CA | 2600097 A1 * | 2/2009 | ......... C23C 14/0641 |
| CA | 2592187 C * | 12/2009 | ............. C22C 21/00 |

(Continued)

OTHER PUBLICATIONS

Machine Translation of WO 2005100631-A1 to Bergmann, Oct. 2005. (Year: 2005).*

*Primary Examiner* — Benjamin L Osterhout
(74) *Attorney, Agent, or Firm* — JCIPRNET

(57) ABSTRACT

The present invention relates to a carbide tool cleaning and coating production line and a method, including a cleaning device including a support frame, a cleaning mechanism and a drying mechanism are sequentially disposed under the support frame connected to a moving mechanism, the mov- (Continued)

ing mechanism is connected to a lifting mechanism being capable of being connected to a tool fixture bracket being configured to accommodate the tool fixture; a coating device including a coating chamber which a plane target mechanism and a turntable assembly disposed in, the turntable assembly is capable of being connected to a plurality of tool fixtures being capable of rotating around an axial line of the coating chamber under the driving of the turntable assembly and rotating around an axial line thereof at the same time; and, a manipulator being disposed between the cleaning device and the coating device.

18 Claims, 14 Drawing Sheets

(51) Int. Cl.
*B08B 3/04* (2006.01)
*B08B 3/12* (2006.01)
*C23C 14/32* (2006.01)
*C23C 14/50* (2006.01)

(56) References Cited

FOREIGN PATENT DOCUMENTS

EP 3153259 A1 * 4/2017 ............. B23B 27/14
WO WO-2005100631 A1 * 10/2005 ........... C23C 14/541

* cited by examiner

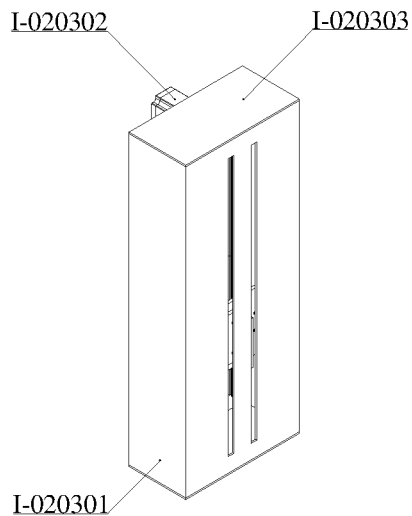
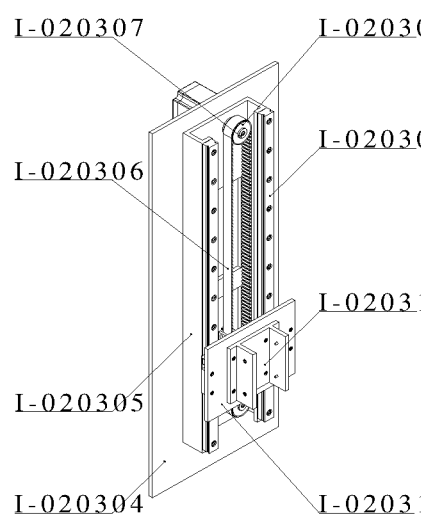
FIG. 8    FIG. 9
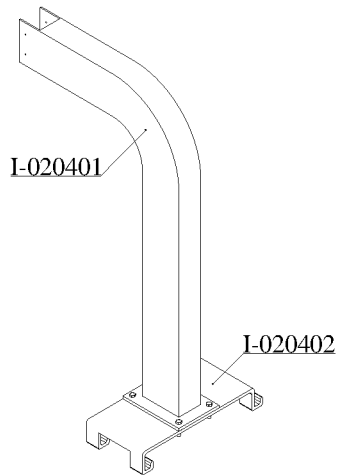
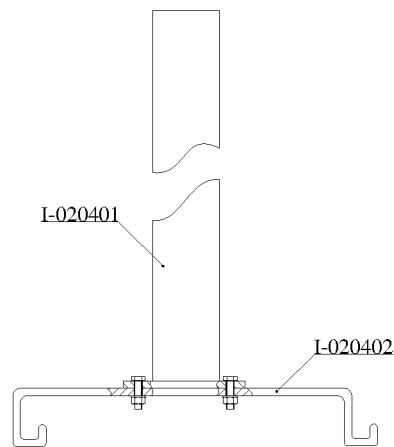
FIG. 10    FIG. 11
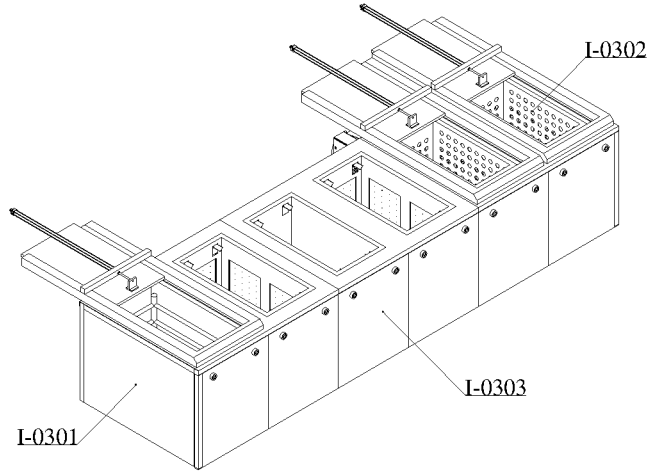
FIG. 12

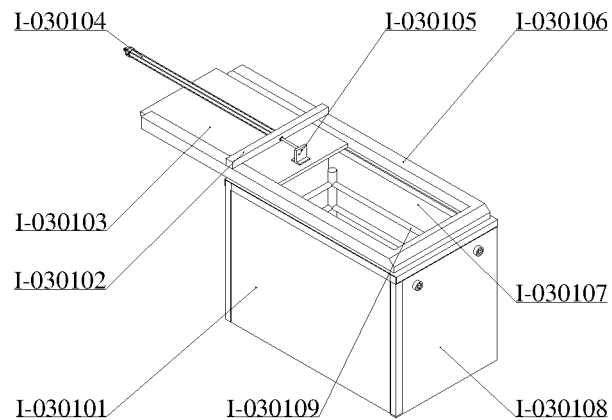
FIG. 13
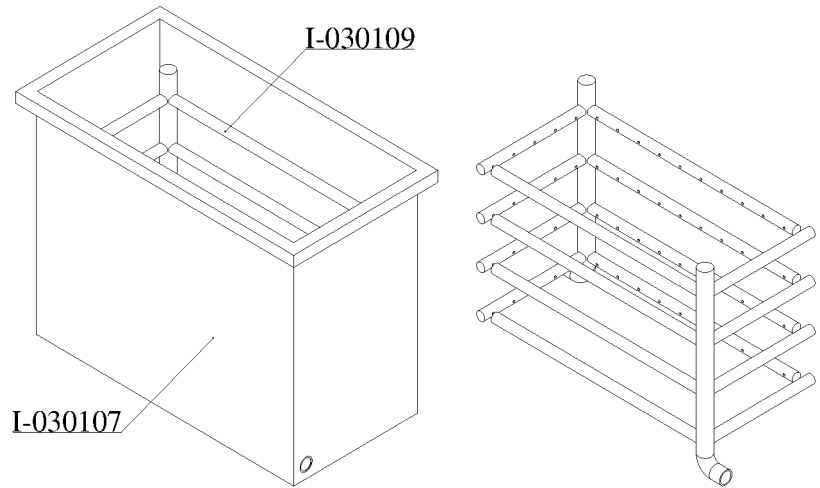
FIG. 14
FIG. 15
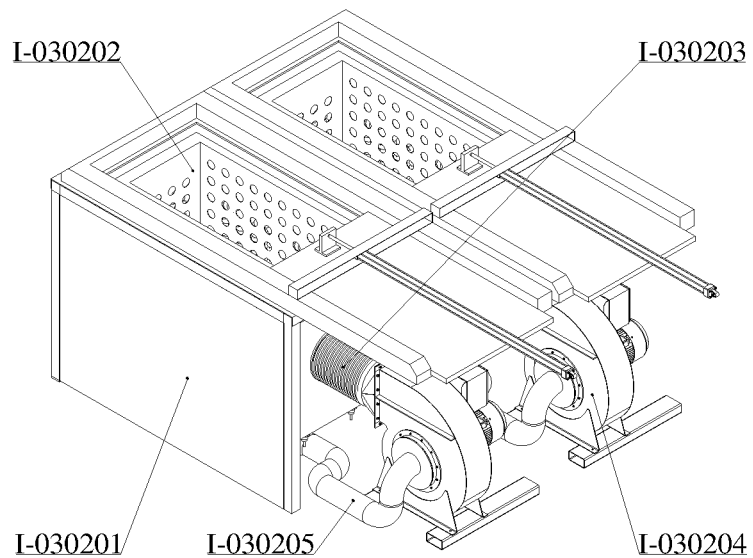
FIG. 16

CARBIDE TOOL CLEANING AND COATING PRODUCTION LINE AND METHOD

BACKGROUND

Technical Field

The present invention relates to the technical field of cleaning and coating, and particularly relates to a carbide tool cleaning and coating production line and a method.

Related Art

Descriptions herein only provide background techniques related to the present invention, and do not necessarily constitute the related art.

A coated tool is prepared by coating a thin layer of good-wear-resistance refractory metal or non-metal compound on the surface of a carbide or high-speed steel substrate with high strength and toughness by a vapor deposition method. The coating is used as a chemical barrier and thermal barrier, and the diffusion and chemical reactions between the tool and a workpiece is reduced, so that the abrasion of the substrate is reduced. The coated tool has the characteristics of high surface hardness, good wear resistance, stable chemical performance, heat resistance, oxidation resistance, small friction coefficient, low heat conductivity and the like. Compared with an uncoated tool, the coated tool can prolong the service life, accelerate the cutting speed, improve the processing precision and reduce the tool consumption cost during cutting.

A vacuum coating machine is needed for tool coating. Additionally, the surface smoothness of the tool needs to be guaranteed before coating, so that the tool needs to be cleaned before coating, and a cleaning device needed for tool cleaning.

However, the inventor found that the existing tool cleaning and coating apparatus has the following defects:

1. The automatic conveyance of the tool between cleaning and coating apparatuses cannot be realized, and the cleaned tool needs to be manually conveyed into the coating apparatus, so that the production efficiency is reduced, and the labor intensity is increased.
2. A cleaning device is single in cleaning mode and poor in cleaning effect.
3. The coating formed by the coating apparatus on the surface of the tool is nonuniform in thickness and poor in quality.

SUMMARY

An objective of the present invention is to overcome the defects in the prior art and provide a carbide tool cleaning and coating production line with high production efficiency and good cleaning and coating quality.

In order to realize the above objectives, the present invention adopts the technical scheme as follows:

In a first aspect, an embodiment of the present invention provides a carbide tool cleaning and coating production line, including a cleaning device and a coating device. A manipulator is disposed between the cleaning device and the coating device.

The cleaning device includes a support frame, a cleaning mechanism and a drying mechanism are sequentially disposed under the support frame, the support frame is connected to a moving mechanism, the moving mechanism is connected to a lifting mechanism, the lifting mechanism is capable of being connected to a tool fixture bracket, and the tool fixture bracket is configured to accommodate a tool fixture.

The coating device includes a coating chamber, a plane target mechanism is disposed in the coating chamber, a turntable assembly is also disposed in the coating chamber, the turntable assembly is capable of being connected to a plurality of tool fixtures, and the tool fixture is capable of rotating around an axial line of the coating chamber under the driving of the turntable assembly, and rotating around an axial line thereof at the same time.

In conjunction with the first aspect, an embodiment of the present invention provides a possible implementation of the first aspect, the cleaning mechanism includes a flushing mechanism and a rinsing mechanism. The flushing mechanism uses a high-pressure flushing pool, and the high-pressure flushing pool is capable of flushing a tool inside the high-pressure flushing pool with high-pressure water. The rinsing mechanism includes a plurality of ultrasonic cleaning pools, a clean water rinsing pool is disposed between the adjacent ultrasonic cleaning pools, lifting elements capable of vertically moving are disposed in the ultrasonic cleaning pool and the clean water rinsing pool, and the lifting elements are connected to rinsing assemblies configured to drive the lifting elements to do ascending and descending movement.

In a second aspect, an embodiment of the present invention provides a working method of the carbide tool cleaning and coating production line. The working method includes: driving, by the moving mechanism, the lifting mechanism to move along the support frame; putting, by the lifting mechanism, the tool cooling connected to a tool into the cleaning mechanism so as to clean the tool; after the cleaning is completed, taking out, by the lifting mechanism, the tool fixture; driving, by the moving mechanism, the lifting mechanism to move; putting, by the lifting mechanism, the tool fixture into the drying mechanism so as to dry the tool; conveying, by the manipulator, the dried tool fixture into the vacuumized coating chamber, and connecting the tool fixture to a driving assembly; driving, by the driving assembly, the tool fixture to rotate around the axial line of the coating chamber; at the same time, driving, by the driving assembly, the tool fixture to rotate around the axial line thereof; and enabling the plane target mechanism to work so as to coat the tool.

The present invention has the following beneficial effects:

1. The production line of the present invention is provided with the manipulator, the conveyance of the tool between the cleaning device and the coating device can be realized by using the manipulator, and the manual conveyance is not needed. Therefore, the automation degree is high, the work efficiency is improved, and the work intensity of workers is reduced.
2. According to the production line of the present invention, the cleaning mechanism includes the flushing mechanism and the rinsing mechanism. The rinsing mechanism uses the ultrasonic cleaning pools and the clean water rinsing pools in alternate arrangement, and has a plurality of cleaning work procedures, so that the cleaning effect is good. Additionally, the drying mechanism is used, so that the cleaned tool can be dried, and thus the quality of the subsequent coating is ensured.
3. According to the production line of the present invention, the tool fixture is capable of rotating around the axial line of the coating chamber under the driving of the driving assembly, and rotating around the axial line thereof at the same time, so that the uniformity of the thickness of the tool coating is ensured, and the coating quality is improved.

BRIEF DESCRIPTION OF THE DRAWINGS

The accompanying drawings constituting a part of this application are used for providing further understanding for this application. Exemplary embodiments of this application and descriptions thereof are used for explaining this application and do not constitute a limitation to this application.

FIG. 8 is an axonometric diagram of a lifting mechanism in Embodiment 1 of the present invention.

FIG. 9 is an axonometric diagram of the lifting mechanism with cover plate removed in Embodiment 1 of the present invention.

FIG. 10 is an axonometric diagram of an elevating device execution assembly in Embodiment 1 of the present invention.

FIG. 11 is a partial cutaway view of the elevating device execution assembly in Embodiment 1 of the present invention.

FIG. 12 is an axonometric diagram of a cleaning line in Embodiment 1 of the present invention.

FIG. 13 is an axonometric diagram of a high-pressure flushing pool in Embodiment 1 of the present invention.

FIG. 14 is an axonometric diagram of a high-pressure flushing chamber in Embodiment 1 of the present invention.

FIG. 15 is an axonometric diagram of a high-pressure water flushing pipe in Embodiment 1 of the present invention.

FIG. 16 is an axonometric diagram of a drying mechanism in Embodiment 1 of the present invention.

Figure 1:
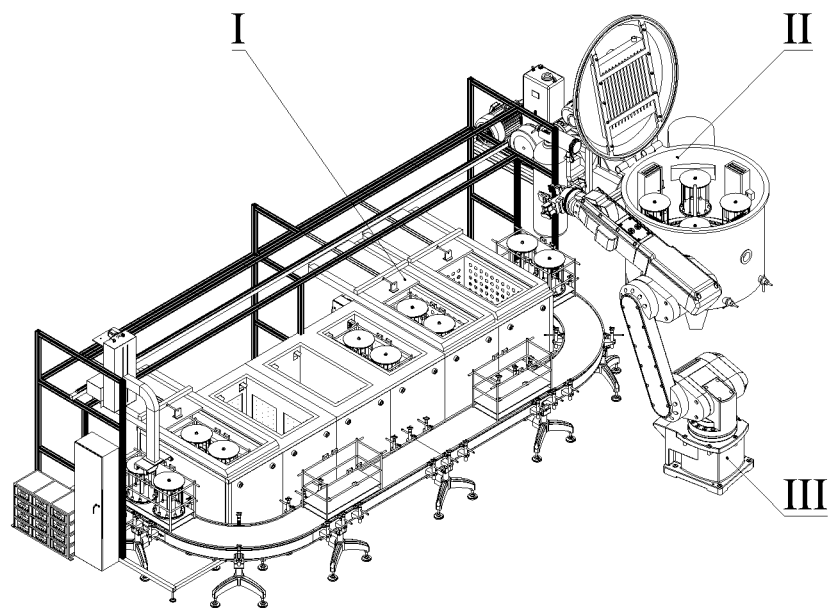
FIG. 1 is an axonometric diagram of an integral structure in Embodiment 1 of the present invention.

In the drawings, I cleaning device, II coating device, and III manipulator.

I-01 ultrasonic generator, I-02 elevating device, I-03 cleaning line, I-04 support frame, I-05 cleaning line fixture, I-06 cleaning line conveying belt, and I-07 control cabinet.

I-0201 moving mechanism, I-0202 elevating device balance assembly, I-0203 lifting mechanism, and I-0204 elevating device execution assembly.

I-020101 moving mechanism small roller, I-020102 moving mechanism cover plate, I-020103 moving mechanism small roller shaft, I-020104 moving mechanism bottom plate, I-020105 moving mechanism shaft end retainer ring, I-020106 moving mechanism gear, I-020107 moving mechanism motor, I-020108 moving mechanism big roller shaft, I-020109 moving mechanism roller frame, I-020110 moving mechanism big roller, and I-020111 moving mechanism motor seat.

I-020201 elevating device balance assembly bottom plate, I-020202 elevating device balance assembly roller shaft, and I-020203 elevating device balance assembly roller.

I-020301 lifting mechanism side cover plate, I-020302 lifting mechanism motor, I-020303 lifting mechanism upper cover plate, I-020304 lifting mechanism bottom plate, I-020305 sliding rail installing seat, I-020306 synchronous belt, I-020307 synchronous pulley shaft end retainer ring, I-020308 synchronous pulley, I-020309 sliding rail, I-020310 elevating execution assembly installing seat, and I-020311 lifting execution assembly moving seat.

I-020401 hanging plate installing frame, and I-020402 hanging plate.

I-0301 high-pressure flushing pool, I-0302 drying mechanism, and I-0303 rinsing pool.

I-030101 high-pressure flushing pool side plate, I-030102 air cylinder installing frame, I-030103 high-pressure flushing pool cover, I-030104 high-pressure flushing pool air cylinder, I-030105 air cylinder piston rod joint, I-030106 high-pressure flushing pool sliding groove, I-030107 high-pressure flushing chamber, I-030108 high-pressure flushing pool front plate, and I-030109 high-pressure water flushing pipe.

I-030201 drying pool side plate, I-030202 drying pool, I-030203 corrugated pipe, I-030204 drying machine, and I-030205 air return pipe.

I-03020201 drying chamber, I-03020202 drying net, and I-03020203 fin heater.

I-030301 first ultrasonic cleaning pool, I-030302 clean water rinsing pool, I-030303 second ultrasonic cleaning pool, and I-030304 rinsing assembly.

I-03030101 ultrasonic vibrator protective cover, I-03030102 ultrasonic cleaning chamber, I-03030103 vibration plate, and I-03030104 ultrasonic vibrator.

I-03030401 transmission plate, I-03030402 rotating wheel, I-03030403 rinsing assembly motor, I-03030404 vertical moving shaft, I-03030405 mounted linear bearing, I-03030406 transmission rod, I-03030407 rinsing transverse rod, I-03030408 transmission rod, I-03030409 mounted bearing, I-03030410 transmission shaft, I-03030411 triangular plate, and I-03030412 rinsing assembly retainer ring.

I-0401 rack, I-0402 elevating device balance frame, I-0403 elevating device rolling frame, and I-0404 cleaning pool installing frame.

I-0501 tool fixture bracket, and I-0502 tool fixture.

I-050101 hanging ring, and I-050102 hole.

I-050201 lower tray, I-050202 blade holding rod, I-050203 upper top tray, I-050204 screw nut, I-050205 lower top tray, I-050206 hexagon socket head cap screw, I-050207 upper tray, and I-050208 fixture tray middle shaft.

I-0601 conveying belt, I-0602 baffle strip, and I-0603 conveying belt support frame.

II-01 coating chamber, II-02 plane target mechanism, II-03 turntable assembly, II-04 cooler, II-05 cooler installing frame, II-06 gas tank, II-07 mechanical pump, II-08 roots pump, II-09 diffusion pump, and II-10 heating pipe.

II-0101 coating cavity, II-0102 diffusion pump connector, II-0103 plane target installing seat, II-0104 coating cover, II-0105 gas port, and II-0106 coating device air cylinder.

II-0201 plane target gear, II-0202 plane target rack, II-0203 arc striking device, II-0204 target material installing plate, II-0205 plane target, II-0206 plane target baffle, II-0207 plane target right side plate, II-0208 magnetic post sliding groove, II-0209 plane target upper plate, II-0210 plane target back plate, II-0211 magnetic post roller, II-0212 magnetic post, II-0213 U-shaped pipe clamp, II-0214 cooling pipe, II-0215 plane target left side plate, II-0216 plane target lower plate, II-0217 magnetic post installing rod, II-0218 magnetic post installing seat, II-0219 linear module, and II-0220 plane target motor.

II-020301 arc striking device seat, II-020302 spring, II-020303 moving rod, II-020304 compression screw, II-020305 arc striking needle, II-020306 position limiting rod, and II-020307 electromagnet.

II-0301 rotating assembly motor, II-0302 gear ring fixing seat, II-0303 planet wheel, II-0304 big turntable, II-0305 rotating shaft, II-0306 rotating assembly, II-0307 sun wheel, II-0308 transmission rod, II-0309 gear shaft end retainer ring, II-0310 gear ring, II-0311 coupling, II-0312 pulley, and II-0313 rotating assembly speed reducer.

II-030601 flat key, II-030602 angular contact ball bearing, II-030603 end cover, and II-030604 bearing sleeve.

III-01 loading and unloading manipulator, and III-02 vision detection device.

IV-0101 coating chamber, IV-0102 gas port, IV-0103 plane target groove, IV-0104 vacuum pump connector, IV-0105 coating chamber cover, IV-0106 coating cover air cylinder, IV-0107 coating cover linear bearing, IV-0108 coating cover sliding shaft, and IV-0109 heater connector.

DETAILED DESCRIPTION

It should be noted that the following detailed descriptions are all exemplary and are intended to provide a further understanding of this application. Unless otherwise specified, all technical and scientific terms used herein have the same meaning as commonly understood by a person of ordinary skill in the art to which the present application belongs.

It should be noted that terms used herein are only for describing specific implementations and are not intended to limit exemplary implementations according to this application. As used herein, the singular form is intended to include the plural form, unless the context clearly indicates otherwise. In addition, it should be further understood that terms "include" and/or "comprise" used in this specification indicate that there are features, steps, operations, devices, assemblies, and/or combinations thereof.

For convenience of description, the words "upper", "lower", "left" and "right", if exist in the present invention, only indicate upper, lower, left and right directions consistent with those of the accompanying drawings, are not intended to limit the structure, and are used only for ease of description of the present invention and brevity of description, rather than indicating or implying that the mentioned device or element needs to have a particular orientation or needs to be constructed and operated in a particular orientation. Therefore, such terms should not be construed as a limitation on the present invention.

As described in the related art, an existing tool coating method has the defects of low automation degree and high work intensity. Aiming at the above problems, the present application provides a carbide tool cleaning and coating production line.

In a typical implementation of Embodiment 1 of the present application, a carbide tool cleaning and coating production line, as shown in FIG. 1, consists of a cleaning device I, a coating device II, and a manipulator III. The cleaning device I and the coating device II are in parallel arrangement. The manipulator III is disposed between the cleaning device and the coating device. A workpiece processed by the cleaning device I is unloaded through the manipulator III, and is further loaded to the coating device II.

Figure 2:
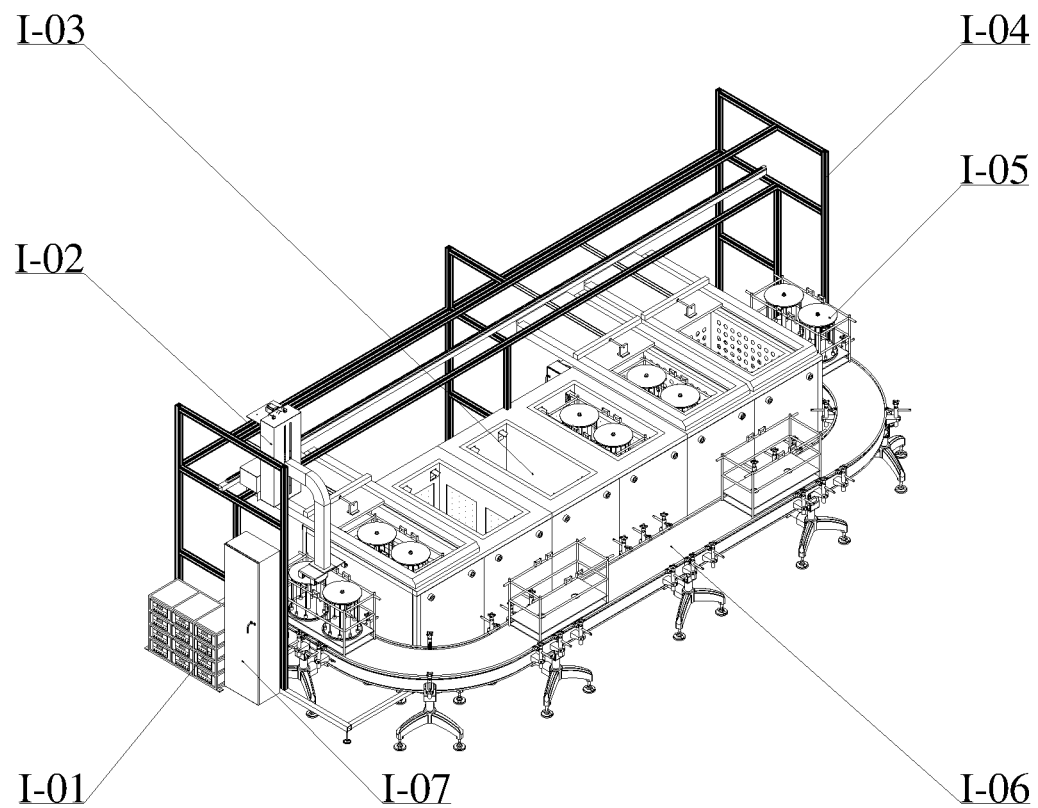
FIG. 2 is an axonometric diagram of a cleaning device in Embodiment 1 of the present invention.

As shown in FIG. 2, the cleaning device consists of an ultrasonic generator I-01, an elevating device I-02, a cleaning line I-03, a support frame I-04, a cleaning line fixture I-05, a conveying mechanism I-06 and a control cabinet I-07. The ultrasonic generator I-01 converts commercial power into a high-frequency alternating current electric signal matched with an ultrasonic transducer to drive the ultrasonic transducer to work. The elevating device I-02 is disposed on the support frame I-04, and can move leftwards and rightwards along the support frame I-04. The cleaning line fixture I-05 can respectively enter cleaning line portions with different functions under the elevating of the elevating device I-02, and is placed onto the conveying mechanism I-06 after all work procedures are completed. The conveying mechanism I-06 can convey a tool fixture bracket of the cleaning line fixture I-05 after unloading back to a starting point. A controller is disposed in the control cabinet I-07. The cleaning line consists of a cleaning mechanism and a drying mechanism.

Figure 3:
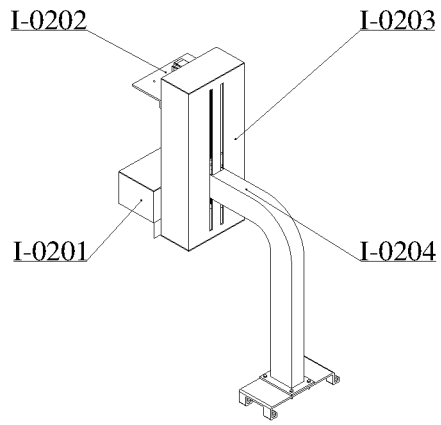
FIG. 3 is an axonometric diagram of an elevating device in Embodiment 1 of the present invention.

As shown in FIG. 3, the elevating device I-02 consists of a moving mechanism I-0201, an elevating device balance assembly I-0202, a lifting mechanism I-0203 and an elevating device execution assembly I-0204. The moving mechanism I-0201 and the elevating device balance assembly I-0202 are fixedly connected behind the lifting mechanism I-0203 through bolts. The moving mechanism I-0201 is disposed at the lower portion of the lifting mechanism I-0203. The elevating device balance assembly I-0202 is disposed at the upper portion of the lifting mechanism I-0203. The elevating device execution assembly I-0204 can be fixedly connected to the moving mechanism in the lifting mechanism I-0203 through screws.

Figure 4:
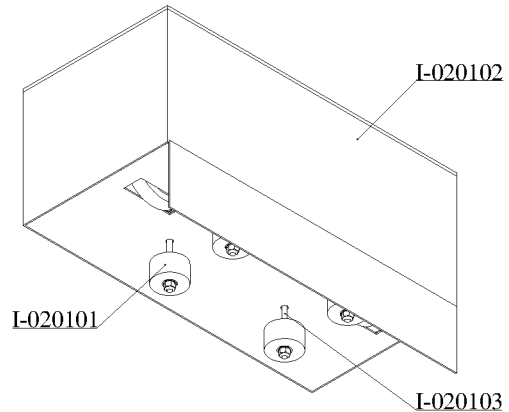
FIG. 4 is an axonometric diagram of a moving mechanism in Embodiment 1 of the present invention.
Figure 5:
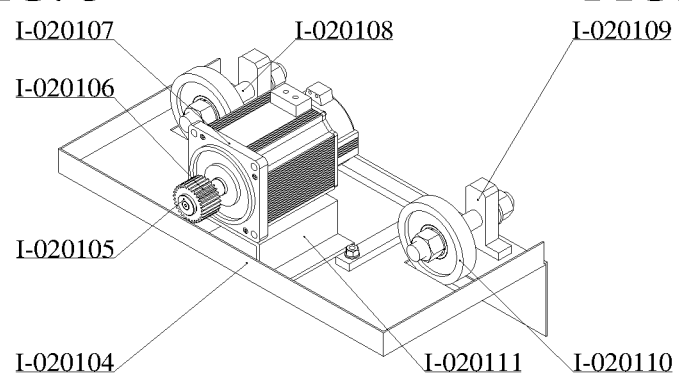
FIG. 5 is an axonometric diagram of the moving mechanism with cover plate removed in Embodiment 1 of the present invention.
Figure 6:
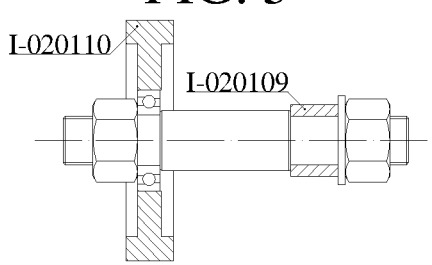
FIG. 6 is a cutaway view of a roller installing mode in Embodiment 1 of the present invention.

As shown in FIG. 4, FIG. 5 and FIG. 6, the moving mechanism I-0201 consists of a moving mechanism small roller I-020101, a moving mechanism cover plate I-020102, a moving mechanism small roller shaft I-020103, a moving mechanism bottom plate I-020104, a moving mechanism shaft end retainer ring I-020105, a moving mechanism gear I-020106, a moving mechanism motor I-020107, a moving mechanism big roller shaft I-020108, a moving mechanism roller frame I-020109, a moving mechanism big roller I-020110, and a moving mechanism motor seat I-020111. In order to achieve rolling smoothness, a bearing is disposed in the middle of the moving mechanism small roller I-020101, the bearing is positioned through a shaft shoulder of the moving mechanism small roller shaft I-020103 and a nut at the lower side, the upper portion of the moving mechanism small roller shaft I-020103 is provided with threads, and the moving mechanism small roller shaft is fixed onto the moving mechanism roller frame I-020109 through a nut. The moving mechanism cover plate I-020102 is fixed above the moving mechanism bottom plate I-020104 so as to prevent impurities from falling into the moving mechanism. The moving mechanism motor I-020107 is fixed above the moving mechanism motor seat I-020111. The moving mechanism gear I-020106 is disposed at an output shaft of the moving mechanism motor I-020107. One end of the moving mechanism gear I-020106 is positioned through the shaft shoulder, and the other end is positioned through the moving mechanism shaft end retainer ring I-020105. The moving mechanism shaft end retainer ring I-020105 is disposed on the output shaft of the moving mechanism motor I-020107 through screws. The moving mechanism big roller I-020110 rolls on the support frame I-04, and a bearing is disposed inside the moving mechanism big roller I-020110. An outer ring of the bearing cooperates with the moving mechanism big roller I-020110, an inner ring of the bearing cooperates with the moving mechanism big roller shaft I-020108, one end of the bearing is positioned through a nut, and the other end of the bearing is positioned through the shaft shoulder. The other end of the moving mechanism big roller shaft I-020108 is fixed onto the moving mechanism roller frame I-020109, and is fixed to the nut through the shaft shoulder. The moving mechanism small roller, the moving mechanism small roller shaft, the moving mechanism big roller and the moving mechanism big roller shaft are relative concepts, and are not intended to limit the sizes of the rollers and the roller shafts.

Figure 7:
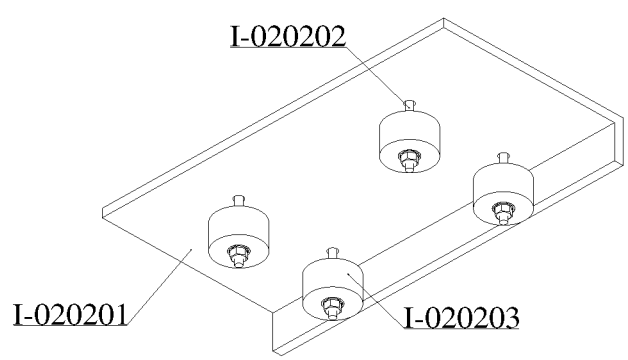
FIG. 7 is an axonometric diagram of an elevating device balance assembly in Embodiment 1 of the present invention.

As shown in FIG. 7, the elevating device balance assembly I-0202 consists of an elevating device balance assembly bottom plate I-020201, an elevating device balance assembly roller shaft I-020202 and an elevating device balance assembly roller I-020203. A bearing is disposed in the elevating device balance assembly roller I-020203, one side of the bearing is positioned through a shaft shoulder of the elevating device balance assembly roller shaft I-020202, and the other side is positioned through a screw nut. The upper portion of the elevating device balance assembly roller shaft I-020202 is provided with threads, and the elevating device balance assembly roller shaft I-020202 is fixed onto the elevating device balance assembly bottom plate I-020201 through nuts.

As shown in FIG. 8 and FIG. 9, the lifting mechanism I-0203 consists of a lifting mechanism side cover plate I-020301, a lifting mechanism motor I-020302, a lifting mechanism upper cover plate I-020303, a lifting mechanism bottom plate I-020304, a sliding rail installing seat I-020305, a synchronous belt I-020306, a synchronous pulley shaft end retainer ring I-020307, a synchronous pulley I-020308, a sliding rail I-020309, an elevating execution assembly installing seat I-020310, and an elevating execution assembly moving seat I-020311. The lifting mechanism side cover plate I-020301 and the lifting mechanism upper cover plate I-020303 are both fixed onto the lifting mechanism bottom plate I-020304, so that other particles such as dust are prevented from falling into the lifting mechanism I-0203. A groove formed in the lifting mechanism side cover plate I-020301 is configured to provide a vertical movement space for the elevating device execution assembly I-0204. The lifting mechanism motor I-020302 is fixed to the back side of the lifting mechanism bottom plate I-020304 through screws, the sliding rail installing seat I-020305 is fixed onto the lifting mechanism bottom plate I-020304 through screws, and the sliding rail I-020309 is fixed onto the sliding rail installing seat I-020305 through screws. An output shaft of the lifting mechanism motor I-020302 passes through the lifting mechanism bottom plate I-020304 and the sliding rail installing seat I-020305, and is connected to the synchronous pulley I-020308 through keys. At the same time, one side of the synchronous pulley I-020308 is positioned through a shaft shoulder, and the other side is positioned through the synchronous belt shaft end retainer ring I-020307. The synchronous belt shaft end retainer ring I-020307 is disposed on the output shaft of the lifting mechanism motor I-020302 through screws. The synchronous belt I-020306 is disposed in a way of cooperating with the synchronous pulley I-020308. The synchronous pulley I-020308 and the synchronous belt I-020306 are meshed through teeth. When the synchronous pulley I-020308 rotates, the synchronous belt I-020306 will be driven to rotate together. The elevating execution assembly installing seat I-020310 is fixedly connected to the synchronous belt I-020306 through bolts. When the synchronous belt I-020306 moves, the elevating execution assembly installing seat I-020310 will be driven to vertically move. A sliding block is disposed at the back side of the elevating execution assembly moving seat I-020311, the sliding block cooperates with the sliding rail I-020309, and can freely slide on the sliding rail I-020309, and thus the stability of the elevating execution assembly installing seat I-020310 in the moving process can be improved. The elevating execution assembly installing seat I-020310 is fixed onto the elevating execution assembly moving seat I-020311 through screws, and the elevating execution assembly installing seat I-020310 can move along with the elevating execution assembly moving seat I-020311.

As shown in FIG. 10 and FIG. 11, the elevating device execution assembly I-0204 consists of a hanging plate installing frame I-020401 and a hanging plate I-020402. The hanging plate I-020402 is fixedly connected to the hanging plate installing frame I-020401 through screws. The hanging plate installing frame I-020401 is fixedly connected to the elevating execution assembly installing seat I-020310 through bolts, and the hanging plate installing frame I-020401 can drive the hanging plate I-020402 to vertically move together.

As shown in FIG. 12, the cleaning line includes a cleaning mechanism and a drying mechanism. The cleaning mechanism includes a high-pressure flushing pool and a rinsing pool. The drying mechanism includes a drying pool.

A workpiece is treated by a high-pressure flushing work procedure in the high-pressure flushing pool I-0301, and impurities and oil stains on the workpiece are primarily flushed through high-pressure water flow. The workpiece is treated by cleaning and rinsing work procedures in the rinsing pool I-0303 to respectively remove impurities, oil stains and a cleaning agent on the workpiece. The workpiece is treated by a drying work procedure in the drying pool I-0302 to dry moisture on the cleaned workpiece.

As shown in FIG. 13, FIG. 14 and FIG. 15, the high-pressure flushing pool I-0301 consists of a high-pressure flushing pool side plate I-030101, an air cylinder installing frame I-030102, a high-pressure flushing pool cover I-030103, a high-pressure flushing pool air cylinder I-030104, an air cylinder piston rod joint I-030105, a high-pressure flushing pool sliding groove I-030106, a high-pressure flushing chamber I-030107, a high-pressure flushing pool front plate I-030108 and a high-pressure water flushing pipe I-030109. The high-pressure flushing pool side plate I-030101 and the high-pressure flushing pool front plate I-030108 are disposed on the periphery of the high-pressure flushing chamber I-030107 to achieve a fixing effect. The high-pressure water flushing pipe I-030109 is disposed in the high-pressure flushing chamber I-030107, and is connected to a high-pressure water source. A plurality of holes are formed in the high-pressure water flushing pipe, and high-pressure water can be sprayed out from the holes to realize the primary flushing on the workpiece. The high-pressure flushing pool sliding groove I-030106 is disposed above the high-pressure flushing chamber I-030107, the air cylinder installing frame I-030102 is welded above the high-pressure flushing pool sliding groove I-030106, the high-pressure flushing pool air cylinder I-030104 is fixed to the air cylinder installing frame I-030102 through screws, and the air cylinder piston rod joint I-030105 is fixed onto the high-pressure flushing pool cover I-030103. At the same time, the air cylinder piston rod joint I-030105 is fixedly connected to the top of a piston rod of the high-pressure flushing pool air cylinder I-030104 through threads. The piston rod of the high-pressure flushing pool air cylinder I-030104 will drive the high-pressure flushing pool cover I-030103 to move together through the air cylinder piston rod joint I-030105 when extending or retracting. The high-pressure flushing pool cover I-030103 can slide in the groove of the high-pressure flushing pool sliding groove I-030106. When the workpiece is put into and taken out from the high-pressure flushing pool I-0301, the piston rod of the high-pressure flushing pool air cylinder I-030104 is in a retracted state, and the high-pressure flushing pool cover I-030103 is opened. During high-pressure water flushing, in order to prevent an accident caused by water sputtering, the piston rod of the high-pressure flushing pool air cylinder I-030104 is in an extending state, and the high-pressure flushing pool cover I-030103 is closed.

Figure 17:
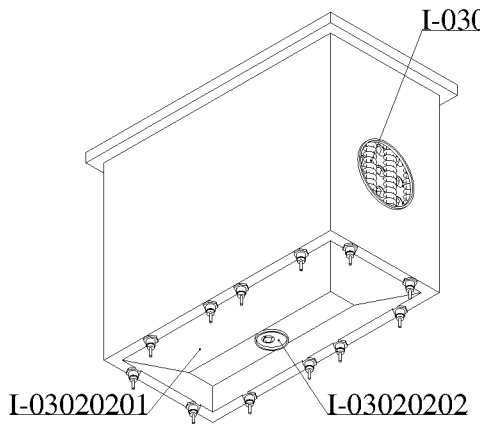
FIG. 17 is an axonometric diagram of a drying chamber in Embodiment 1 of the present invention.
Figure 18:
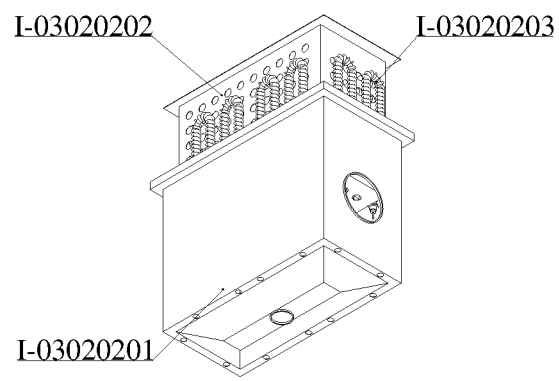
FIG. 18 is an exploded view of the drying chamber in Embodiment 1 of the present invention.

As shown in FIG. 16, FIG. 17 and FIG. 18, the drying mechanism I-0302 consists of a drying pool side plate I-030201, a drying pool I-030202, a corrugated pipe I-030203, a drying machine I-030204 and an air return pipe I-030205. The drying pool side plates I-030201 are fixed at two sides of the drying pool to achieve a protective effect. The drying pool forms a drying chamber I-03020201 for drying the cleaned workpiece. The drying machine I-030204 is fixed behind the drying pool I-030202, an air outlet of the drying machine I-030204 is connected to the corrugated pipe I-030203, and an air inlet of the drying machine I-030204 is connected to the air return pipe I-030205. At the same time, the corrugated pipe I-030203 is connected to an air inlet at the side surface of the drying chamber I-03020201, and the air return pipe I-030205 is connected to an air outlet at the bottom of the drying chamber I-03020201. A fin heater I-03020203 is fixedly connected to a hole of the bottom of the drying chamber I-03020201 through threads, a drying net I-03020202 is fixedly connected to the drying chamber I-03020201, the side wall and the bottom of the drying net I-03020202 are provided with a plurality of small holes, so that the air can freely circulate. A gap is formed between the drying net I-03020202 and the drying pool I-030202, and the fin heater I-03020203 is disposed in the gap. In the present embodiment, the fin heater is used as a heating element of the drying mechanism. At the same time, a cover opening and closing device of the same structure as that of the high-pressure flushing pool I-0301 is disposed on the drying mechanism I-0302. When the drying is started, the drying chamber cover is closed, the drying machine I-030204 is started, the air is blown out from the air outlet of the drying machine I-030204, enters the drying chamber I-03020201 through the corrugated pipe I-030203 and the holes in the side surface of the drying chamber I-03020201, is heated through the fin heater I-03020203, and enters the drying net I-03020202 through the holes of the drying net I-03020202, and the hot air continuously flows in the drying mechanism, so that moisture on the workpiece can be removed. The hot air can enter the drying machine I-030204 from the holes at the bottom of the drying chamber I-03020201 through the air return pipe I-030205, so that the hot air can be cyclically used, and the energy sources are saved.

Figure 19:
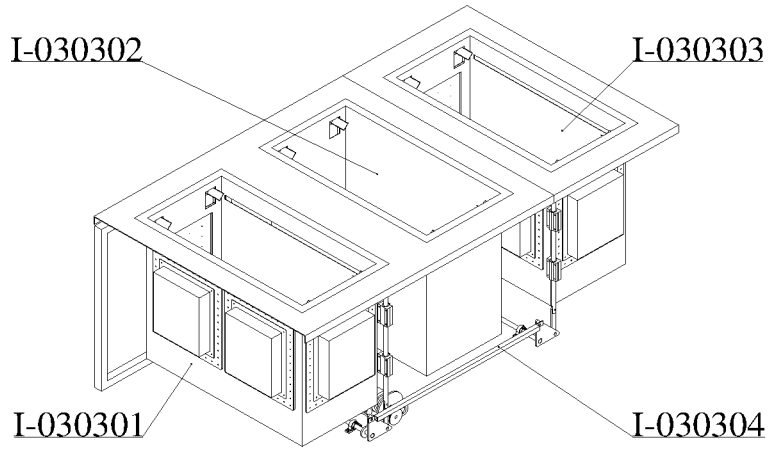
FIG. 19 is an axonometric diagram of a rinsing pool in Embodiment 1 of the present invention.

As shown in FIG. 19, the rinsing pool I-0303 consists of a first ultrasonic cleaning pool I-030301, a clean water rinsing pool I-030302, a second ultrasonic cleaning pool I-030303 and a rinsing assembly I-030304. A workpiece is ultrasonically cleaned in the first ultrasonic cleaning pool I-030301. A cleaning agent is added into the first ultrasonic cleaning pool I-030303, so that oil stains on the workpiece can be washed away. The workpiece can be primarily rinsed by the clean water rinsing pool I-030302, and can be secondarily rinsed by the second ultrasonic cleaning pool I-030303. Heating pipes are disposed at both the bottoms of the ultrasonic cleaning pool and the clean water rinsing pool to heat the water in the rinsing pool. At the same time, a thermocouple should be provided to monitor the water temperature to ensure that the water temperature is within a work range. The rinsing assembly I-030304 can drive the workpiece to vertically move through a lifting element, enhancing the cleaning effect. An ultrasonic vibrator is connected to an ultrasonic generator, and the ultrasonic generator is used to convert commercial power into a high-frequency alternating current electric signal matched with an ultrasonic transducer to drive the ultrasonic vibrators to work. Tiny bubble nuclei in the liquid vibrate under the ultrasonic effect. When the sound pressure reaches a certain value, bubbles will fast expand and are then suddenly closed. Impact waves are generated when the bubbles are closed to remove the impurities on the surface of a blade.

The cleaning agent is contained in the ultrasonic cleaning pool, so that the oil stains on the blade can be cleared way.

Figure 20:
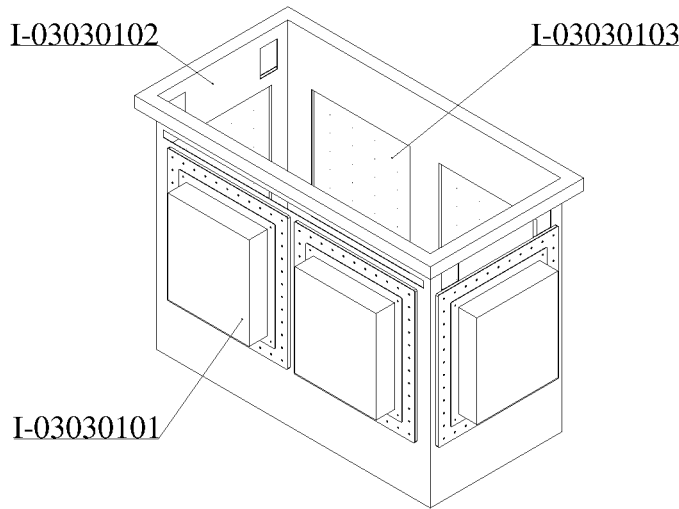
FIG. 20 is an axonometric diagram of an ultrasonic cleaning pool in Embodiment 1 of the present invention.
Figure 21:
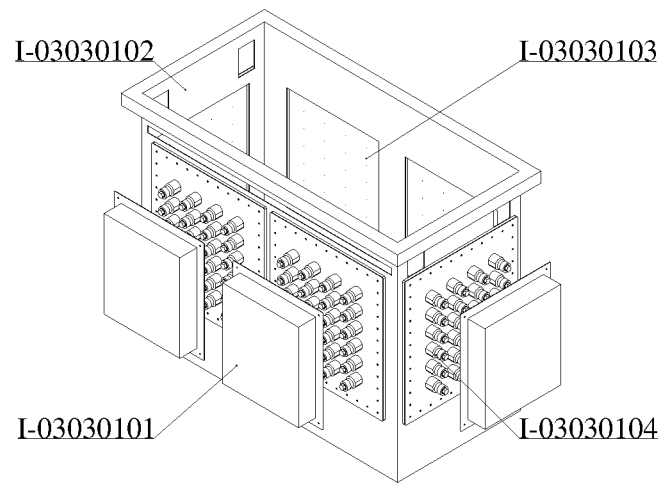
FIG. 21 is an exploded view of the ultrasonic cleaning pool in Embodiment 1 of the present invention.

As shown in FIG. 20 and FIG. 21, the structures of the first ultrasonic cleaning pool and the second ultrasonic cleaning pool are identical. The first ultrasonic cleaning pool I-030301 consists of an ultrasonic vibrator protective cover I-03030101, an ultrasonic cleaning chamber I-03030102, a vibration plate I-03030103 and an ultrasonic vibrator I-03030104. The vibration plate I-03030103 is fixed to the periphery of the ultrasonic cleaning chamber I-03030102 by welding and gluing, and the ultrasonic vibrator I-03030104 is fixed onto the vibration plate I-03030103 in arrays through screws and glue. The ultrasonic vibrator protective cover I-03030101 is fixed onto the vibration plate I-03030103 through screws, and achieve a protective effect on the ultrasonic vibrator I-03030104.

Figure 22:
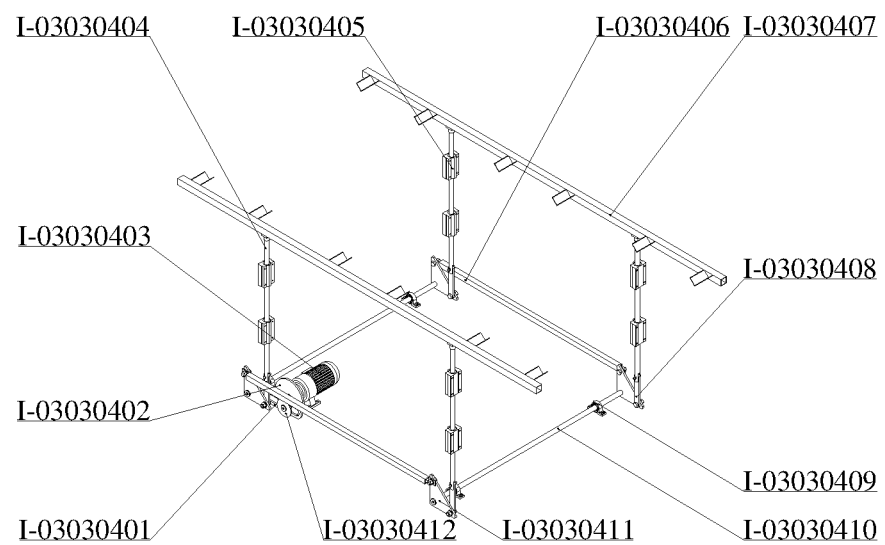
FIG. 22 is an axonometric diagram of a rinsing assembly in Embodiment 1 of the present invention.

As shown in FIG. 22, the rinsing assembly I-030304 consists of a transmission plate I-03030401, a rotating wheel I-03030402, a rinsing assembly motor I-03030403, vertical moving shafts I-03030404, mounted linear bearings I-03030405, transmission rods I-03030406, rinsing transverse rods I-03030407, transmission rods I-03030408, mounted bearings I-03030409, transmission shafts I-03030410, triangular plates I-03030411 and a rinsing assembly retainer ring I-03030412. An output shaft of the rinsing assembly motor I-03030403 is connected to the rotating wheel. Through the rotation of the rinsing assembly motor, the rotating wheel I-03030402 can be driven to rotate. A shaft is fixed to an eccentric position of the rotating wheel I-03030402, and passes through a groove of the transmission plate I-03030401, and the tail end is provided with the rinsing assembly retainer ring I-03030412 fixed by screws, so that the transmission plate I-03030401 is prevented from falling. The transmission plate I-03030401 uses the transmission shaft I-03030410 as a rotating center, when the rotating wheel I-03030402 rotates, the transmission plate I-03030401 will be driven to swing along the rotating center. The transmission plate I-03030401 is fixedly connected to the transmission shaft I-03030410. When the transmission plate I-03030401 swings, the transmission shaft I-03030410 will be driven to rotate to and fro in a certain angle. Each of the transmission shafts I-03030410 is provided with two mounted bearings I-03030409. The mounted bearings are fixedly disposed for supporting the transmission shafts. The transmission shaft I-03030410 is fixedly connected to the triangular plate I-03030411 through nuts. The triangular plate I-03030411 can also rotate in a certain range along with the transmission shaft I-03030410. A hole in the upper side of the triangular plate I-03030411 is rotatably connected to the transmission rod I-03030406 through a bolt, a hole at the lower side of the triangular plate is rotatably connected to a hole at the lower side of the transmission rod I-03030408 through a bolt, and a hole at the upper side of the transmission rod I-03030408 is rotatably connected to a hole at the lower side of the vertical moving shaft I-03030404 through a bolt. Each of the vertical moving shafts I-03030404 is provided with two mounted linear bearings I-03030405, and the mounted linear bearings I-03030405 are fixed onto an external frame body through screws. The rinsing transverse rod I-03030407 is welded to the top of the vertical moving shaft I-03030404. When the left triangular plate I-03030411 swings, the transmission rod I-03030406 is driven to move leftwards and rightwards, and the transmission rod can drive the right triangular plate I-03030411 to swing. When the four triangular plates I-03030411 swing, the transmission rod I-03030408 can be driven to vertically move at the same time. Through the vertical movement of the transmission rod I-03030408, the vertical moving shaft I-03030404 can be driven to move together, the vertical moving shaft I-03030404 vertically slide in the mounted linear bearing I-03030405, the rinsing transverse rod I-03030407 can vertically move under the driving of the vertical moving shaft I-03030404, the lifting element on the rinsing transverse rod I-03030407 extends into the ultrasonic cleaning pool and the clean water rinsing pool through a lifting groove, and thus the tool fixture I-05 can be driven to vertically move, so that there will no tool fixture accumulated on the elevating device I-02. At the same time, the rinsing effect is enhanced, and the dirt deposition is avoided.

Figure 23:
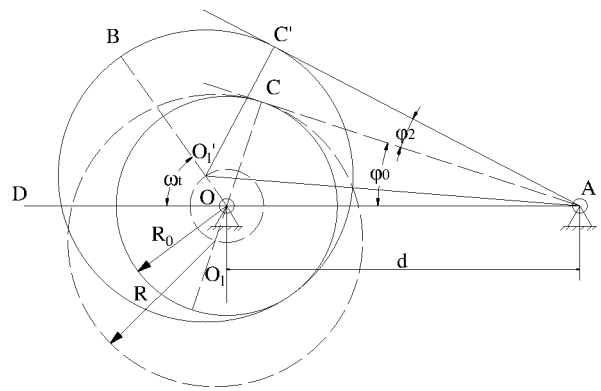
FIG. 23 is a principle diagram of an oscillating follower cam mechanism.

As shown in FIG. 23, part of mechanisms can be simplified into an oscillating follower cam mechanism. The transmission plate I-03030401 is simplified into an oscillating follower, and the rotating wheel I-03030402 is simplified into a cam. Point O is the rotating center of the cam, R is the radius of an eccentric wheel, $R_0$ is the base radius of the cam, C is a contact point of a swinging rod and the cam, d is the length of a machine frame, $\omega$ is the rotating speed of the cam, $\omega_t$ is a rotating angle of the cam at an arbitrary moment, and e is the eccentric distance.

$$e=\overline{OO_1}=\overline{OO_1'}=R-R_0 \tag{1, and}$$

$$\overline{OC}=\overline{O_1C}-\overline{OO_1}=R-e \tag{2}$$

In Rt$\Delta$OAC:

$$\varphi_0 = \arcsin\frac{(R-e)}{d}. \tag{3}$$

In $\Delta OO_1'$ A, according to cosine law, the following is obtained:

$$\overline{O_1A}=\sqrt{d^2+e^2+2de\cos\omega_t} \tag{4}$$

In $\Delta OO_1'$ A, according to sine law, the following is obtained:

$$\angle OAO_1' = \arcsin\frac{e\sin\omega_t}{\sqrt{d^2+e^2+2de\sin\omega_t}}. \tag{5}$$

In Rt$\gamma O_1 C'$ A:

$$\angle O_1'AC' = \arcsin\frac{R}{\sqrt{d^2+e^2+2de\sin\omega_1}}. \tag{6}$$

Through FIG. 23 and Formula (3), Formula (5) and Formula (6), the following can be obtained:

$$\varphi_2 = \tag{7}$$
$$(\angle O_1'AC + \angle OAO_1') - \varphi_0 = \arcsin\frac{R}{E} + \arcsin\frac{e\sin\omega_t}{E} - \arcsin\frac{(R-e)}{d}.$$

In the formula:

$$E=\sqrt{d^2+e^2+2de\cos\omega_t} \tag{8}$$

An angular speed $\omega_2$ of the driven element is a first-order derivative of the angular displacement and the time t. Take the derivative of Formula (7) to obtain the following after sorting:

$$\omega_2 = \varphi_2' \left( \frac{E^2 \cos \omega_t + de \sin^2 \omega_t}{\sqrt{E^2 - e^2 \sin^2 \omega_t}} + \frac{dR \sin \omega_t}{\sqrt{E^2 - R^2}} \right) \cdot \frac{e\omega}{E^2}. \quad (9)$$

Figure 24:
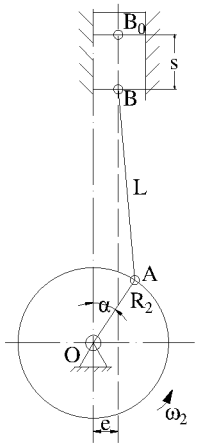
FIG. 24 is a principle diagram of a slider-crank mechanism.

As shown in FIG. 24, the other part of mechanisms can be simplified into a slider-crank mechanism. The transmission plate I-03030401 is simplified into a crank, the transmission rod I-03030406 is simplified into a connecting rod, the vertical moving shaft I-03030404 is simplified into a sliding block, and the positions are limited by the mounted linear bearings.

O is the rotating center of the crank, A is the connecting point of the crank and the connecting rod, B is the connecting point of the connecting rod and the sliding block, $R_2$ is the rotating radius of the crank, L is the length of the connecting rod, e is the offset distance, and $\omega_2$ is the rotating angular speed of the crank. The sliding block is enabled to reach a limit position $B_0$ after moving a distance S.

The displacement, speed, and acceleration of the sliding block is as follows:

$$\overline{S} = \overline{B_0 B} \quad \overline{V} = \frac{d\overline{S}}{dt} \quad \overline{\omega} = \frac{d\overline{\alpha}}{dt} \quad \overline{a} = \frac{d\overline{V}}{dt} \quad (10)$$

$$S = \sqrt{(R_2 + L)^2 - e^2} - (R_2 \cos\alpha + L\cos\beta),$$

and $$L\sin\beta = R_2 \sin\alpha + e. \quad (11)$$

(10) and (11) are combined to obtain:

$$S = \sqrt{(R_2 + L)^2 - e^2} - R_2 \cos\alpha - \sqrt{L^2 - (R_2 \sin\alpha + e)^2}, \quad (12)$$

$$V = \frac{dS}{dt} = \frac{dS}{d\alpha} \cdot \frac{d\alpha}{dt} = S = -\left[ R_2 \cos\alpha + \frac{R_2 \cos\alpha(R_2 \sin\alpha + e)}{\sqrt{L^2 - (R_2 \sin\alpha + e)^2}} \right] \frac{d\alpha}{dt}, \quad (13)$$

and $$\omega_2 = \frac{d\alpha}{dt} \quad (14)$$

(13) and (14) are combined to obtain:

$$V = R_2 \omega_2 \left[ \sin\alpha + \frac{\cos\alpha(R_2 \sin\alpha + e)}{\sqrt{L^2 - (R_2 \sin\alpha + e)^2}} \right], \quad (15)$$

and $$a = \frac{dV}{dt} = \frac{dV}{d\alpha} \cdot \frac{d\alpha}{dt}. \quad (16)$$

(9), (15) and (16) are combined to obtain:

$$V = R_2 \left[ \varphi_2' \left( \frac{E^2 \cos \omega_t + de \sin^2 \omega_t}{\sqrt{E^2 - e^2 \sin^2 \omega_t}} + \frac{dR \sin \omega_t}{\sqrt{E^2 - R^2}} \right) \frac{e\omega}{E^2} \right] \quad (17)$$

$$\left[ \sin\alpha + \frac{\cos\alpha(R_2 \sin\alpha + e)}{\sqrt{L^2 - (R_2 \sin\alpha + e)^2}} \right].$$

That is, the vertical moving speed of the workpiece driven by the rinsing assembly I-030304 conforms to the conditions of the above formulas.

Figure 25:
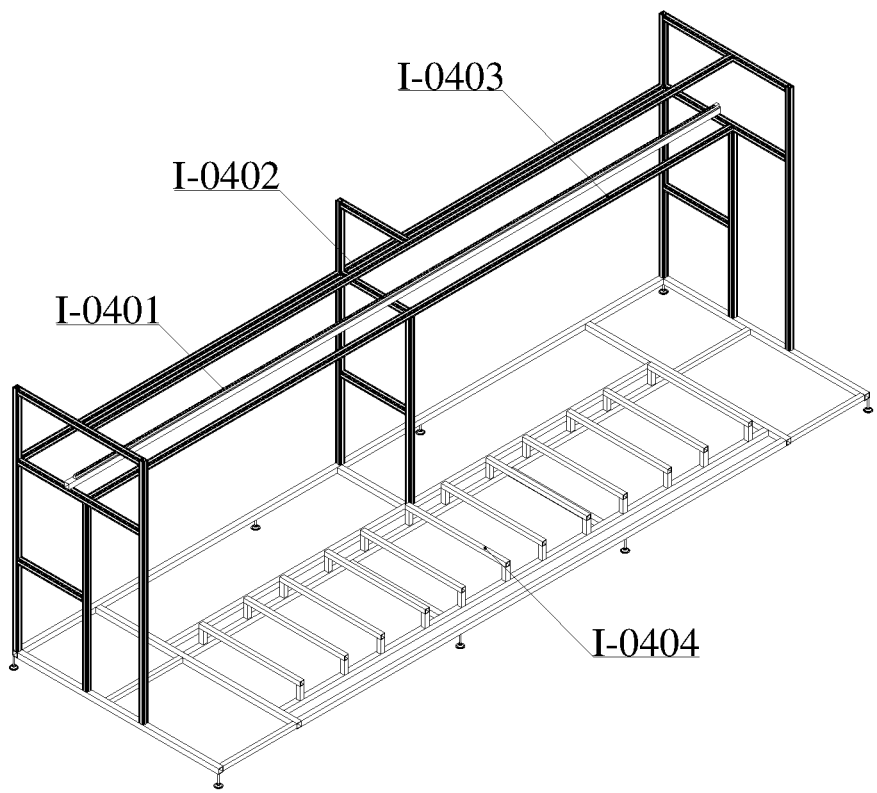
FIG. 25 is an axonometric diagram of a support frame in Embodiment 1 of the present invention.

As shown in FIG. 25, the support frame I-04 consists of a rack I-0401, an elevating device rolling frame I-0403, an elevating device balance frame I-0402 and a cleaning pool installing frame I-0404. The rack I-0401 is fixed onto a vertical support post of the support frame I-04. The moving mechanism gear I-020106 is meshed with the rack I-0401. Through the rotation of the moving mechanism gear I-020106, the moving mechanism I-02 will be driven to horizontally move. The moving mechanism big roller I-020110 rolls above the elevating device rolling frame I-0403, and the moving mechanism small rollers I-020101 will roll at the two sides of the elevating device rolling frame I-0403. The elevating device balance assembly roller I-020203 will roll at the two sides of the elevating device balance frame I-0402. The cleaning pool I-03 is disposed on the cleaning pool installing frame I-0404.

Figures 26, 27:
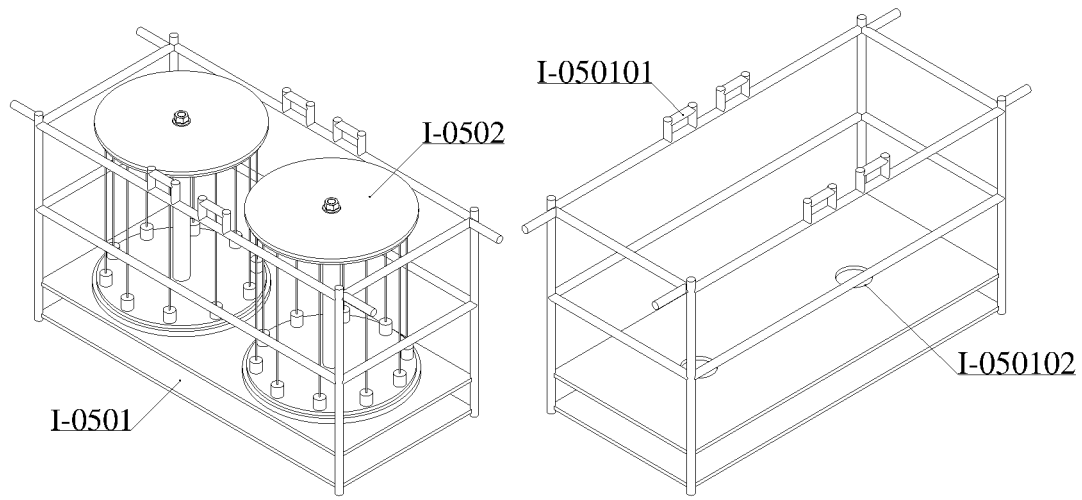
FIG. 26 is an axonometric diagram of a cleaning line fixture in Embodiment 1 of the present invention.
FIG. 27 is an axonometric diagram of a tool fixture bracket in Embodiment 1 of the present invention.

As shown in FIG. 26, the cleaning line fixture I-05 consists of a tool fixture bracket I-0501 and a tool fixture I-0502. The tool fixture I-0502 can be disposed in the tool fixture bracket I-0501.

As shown in FIG. 27, a hanging ring I-050101 at the upper side of the tool fixture bracket I-0501 is disposed for facilitating the grasping of a lifting hook of the hanging plate I-020402. A hole I-050102 at the lower side of the tool fixture bracket I-0501 is configured to accommodate the tool fixture I-0502.

Figure 28:
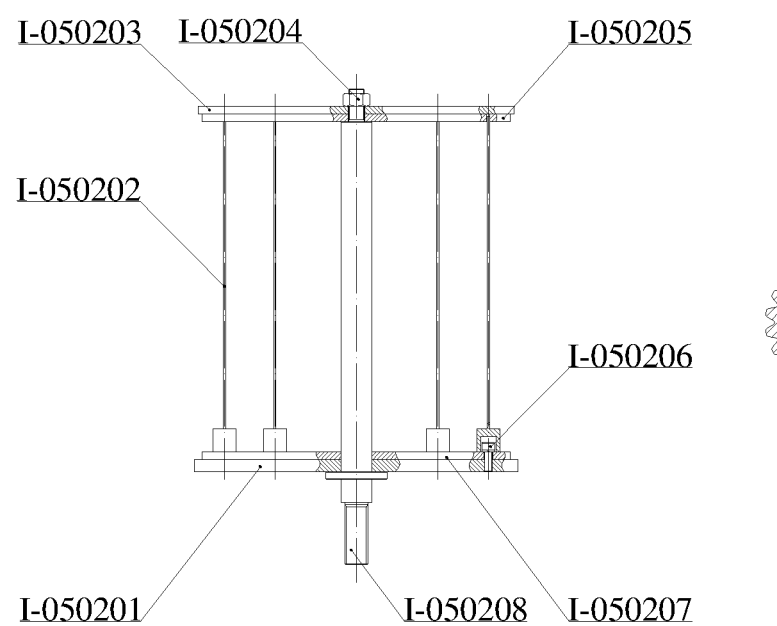
FIG. 28 is a schematic diagram of a tool fixture in Embodiment 1 of the present invention.

As shown in FIG. 28, the tool fixture I-0502 consists of a lower tray I-050201, a blade holding rod I-050202, an upper top tray I-050203, a nut I-050204, a lower top tray I-050205, a hexagon socket head cap screw I-050206, an upper tray I-050207 and a fixture tray middle shaft I-050208. The lower tray is fixed to the upper tray, the upper top tray is fixed to the lower top tray, and the lower tray I-050201 and the upper tray I-050207 are disposed at the lower portion of the tool fixture I-0502 and are positioned through a shaft shoulder. The end of the upper top tray I-050203 is provided with threads. The upper top tray I-050203 and the lower top tray I-050205 are fixed to the nut I-050204 through the shaft shoulder at the upper side of the fixture tray middle shaft I-050208, and an inner spline is disposed under the fixture tray middle shaft I-050208. Threaded holes are formed in the lower tray I-050201 and the upper tray I-050207. The hexagon socket head cap screw I-050206 is fixed onto the lower tray I-050201 and the upper tray I-050207 through threads.

A hole is formed in the lower tray I-050205, the lower side of the blade holding rod I-050202 cooperate with the hexagon socket head cap screw I-050206. The upper side of the blade holding rod I-050202 cooperate with the hole of the lower tray I-050205. The blade holding rod I-050202 can pass through hole in the workpiece to fix the workpiece on the blade holding rod.

Figure 29:
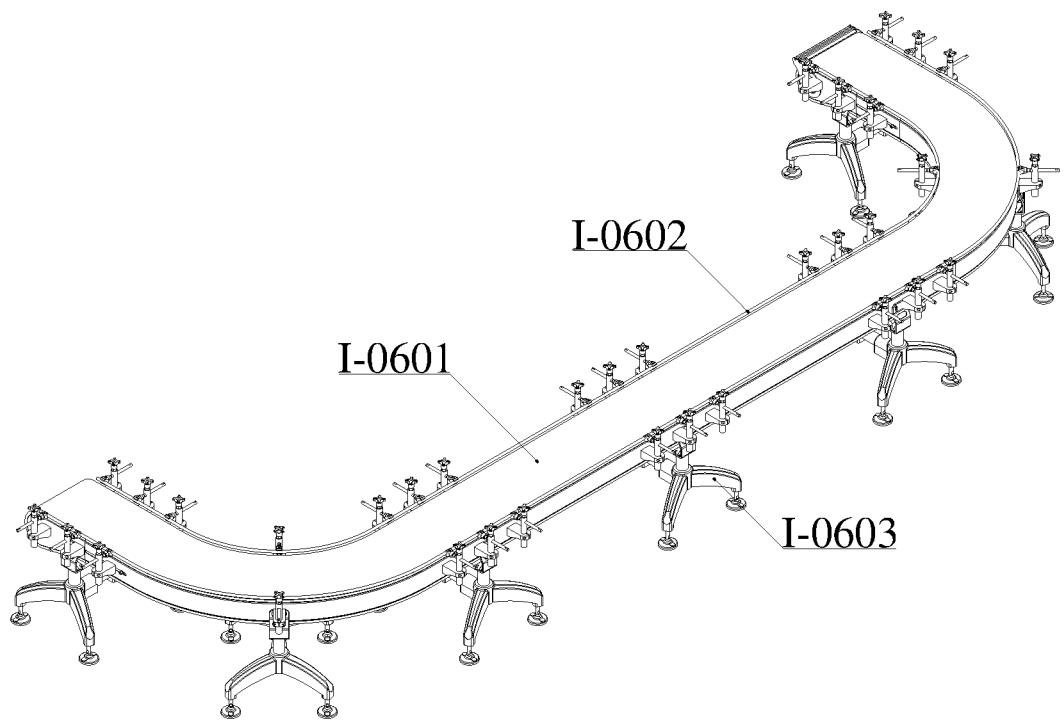
FIG. 29 is an axonometric diagram of a conveying mechanism in Embodiment 1 of the present invention.

As shown in FIG. 29, a conveying mechanism is disposed on the outer periphery of the cleaning mechanism and the drying mechanism. The conveying mechanism I-06 uses an existing belt conveying mechanism, and consists of elements such as a conveying belt I-0601, baffle strips I-0602, a conveying belt support frame I-0603, a driving pulley, a driven pulley and a pulley motor. The conveying belt support frame I-0603 achieves a support effect, the baffle strips I-0602 are fixed to two sides of the conveying belt to achieve protective and position limiting effects, preventing the tool fixture bracket I-0501 from falling. The conveying belt I-0601 conveys the tool fixture bracket I-0501 from an unloading position to a loading position. A position limiting rod is disposed at the edge of the conveying belt. Additionally, a sensor is disposed at the terminal of the conveying belt.

Both are configured to prevent the fixture frame from falling.

Figure 30:
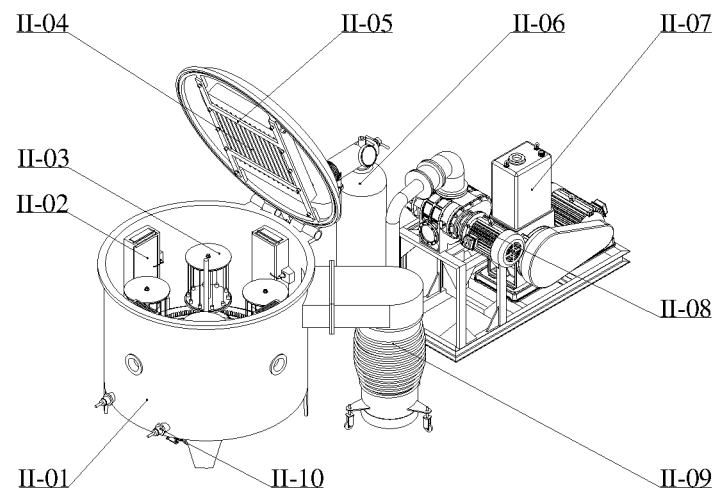
FIG. 30 is an axonometric diagram of a coating device in Embodiment 1 of the present invention.

As shown in FIG. 30, the coating device II consists of a coating chamber II-01, a plane target mechanism II-02, a turntable assembly II-03, a cooler II-04, a cooler installing frame II-05, a gas tank II-06, a mechanical pump II-07, a roots pump II-08, a diffusion pump II-09 and a heating pipe II-10. Four plane target mechanisms II-02 are disposed in the coating chamber II-01, and are disposed at the periphery of the inner wall of the coating chamber II-01. The turntable assembly II-03 is disposed in the coating chamber II-01, and can rotate during coating. The cooler installing frame II-05 is disposed on the top of the coating chamber II-01 through screws, and the cooler II-04 is fixed onto the cooler installing frame II-05 through screws so as to lower the temperature in the cooling chamber II-01. The gas tank II-06 introduces the gas of needed coating elements into the coating chamber II-01. The mechanical pump II-07, the roots pump II-08 and the diffusion pump II-09 are connected in series to form a vacuum pump group to form a vacuum pumping mechanism, and are sequentially started to vacuumize the coating chamber II-01. The coating chamber is also provided with the heating pipe.

Figure 31:
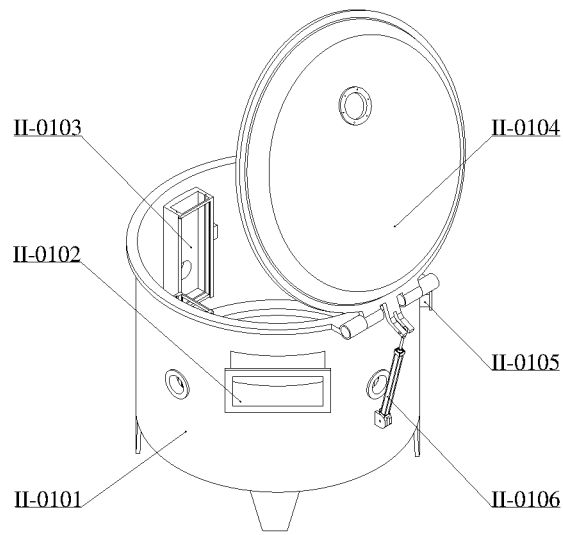
FIG. 31 is an axonometric diagram of a coating chamber in Embodiment 1 of the present invention.

As shown in FIG. 31, the coating chamber II-01 consists of a coating cavity II-0101, a diffusion pump connector II-0102, a plane target installing seat II-0103, a coating cover II-0104, a gas port II-0105 and a coating device air cylinder II-0106. The coating cavity II-0101 is in contact with the ground, and partial devices required for coating are disposed therein. Four plane target installing seats II-0103 are provided, which are configured to install the plane target mechanism II-02, and are fixed to the periphery of the inner wall of the coating cavity I-0101. A sliding groove is formed in the plane target installing seat II-0103, and the plane target mechanism II-02 can be inserted and disposed in the plane target installing seat II-0103. The diffusion pump connector II-0102 is a gas outlet which communicates with the diffusion pump II-09, and during vacuum pumping, the gas is pumped out from this gas outlet. The gas port II-0105 is a gas inlet which is connected to the gas tank II-06, and the gas enters the coating chamber from this gas inlet. An installing table is disposed on the coating cover II-0104 for installing the cooler II-04 and the cooler installing frame II-05. The cooler is used as a first cooling element of the coating device.

The coating cover II-0104 is connected to the coating cavity II-0101 through a hinge. A piston rod of the coating device air cylinder II-0106 is connected to the coating cover II-0104 through a hinge. A lug ring at the tail portion of the coating device air cylinder II-0106 is also connected to the coating cavity II-0101 through a hinge. During vacuum pumping, the piston rod of the coating device air cylinder II-0106 extends out, the coating cover II-0104 is closed, a sealing device is disposed on the coating cover II-0104, and the coating cavity II-0101 is in a sealed state, so that subsequent vacuum pumping is facilitated. After the coating is completed, the piston rod of the coating device air cylinder II-0106 is retracted, and the coating cover II-0104 is opened.

Figure 32:
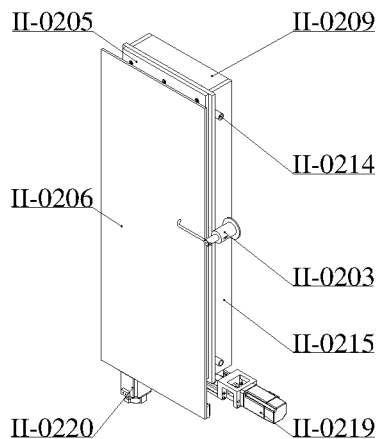
FIG. 32 is an axonometric diagram of a plane target mechanism with baffle closed in Embodiment 1 of the present invention.
Figure 33:
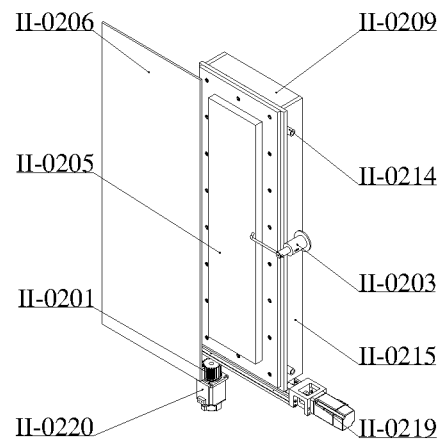
FIG. 33 is an axonometric diagram of a plane target mechanism with baffle opened in Embodiment 1 of the present invention.
Figure 34:
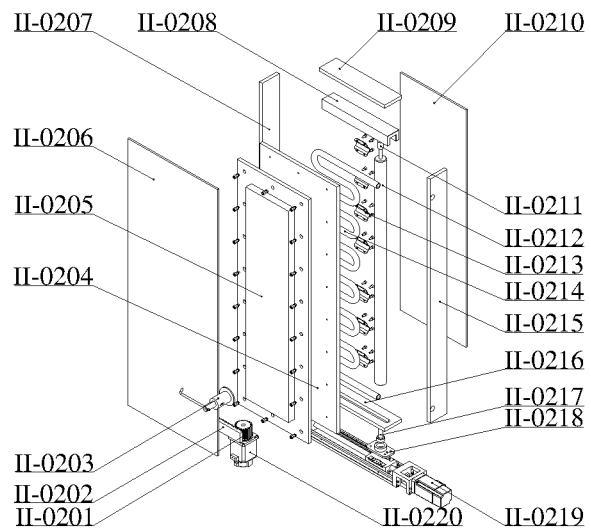
FIG. 34 is an exploded view of the plane target mechanism in Embodiment 1 of the present invention.

As shown in FIG. 32, FIG. 33 and FIG. 34, the plane target mechanism II-02 consists of a plane target gear II-0201, a plane target rack II-0202, an arc striking device II-0203, a target material installing plate II-0204, a plane target II-0205, a plane target baffle II-0206, a plane target right side plate II-0207, a magnetic post sliding groove II-0208, a plane target upper plate II-0209, a plane target back plate II-0210, a magnetic post roller II-0211, a magnetic post II-0212, a U-shaped pipe clamp II-0213, a cooling pipe II-0214, a plane target left side plate II-0215, a plane target lower plate II-0216, a magnetic post installing rod II-0217, a magnetic post installing seat II-0218, a linear module II-0219 and a plane target motor II-0220. The plane target gear II-0201 is connected to the plane target motor II-0220 through keys, the plane target motor is fixed onto the plane target installing seat, and the plane target gear II-0201 is axially positioned through a shaft end retainer ring and a shaft shoulder of an output shaft of the plane target motor II-0220. The plane target rack II-0202 is fixedly connected to the bottom of the plane target baffle II-0206. When the plane target motor II-0220 rotates, the plane target gear II-0201 will be driven to rotate through the key, and the plane target gear II-0201 and the plane target rack II-0202 are transmitted through teeth meshing. When the plane target gear II-0201 rotates, the plane target rack II-0202 will be driven to move leftwards and rightwards. The plane target rack II-0202 is fixedly connected to the plane target baffle II-0206, so that the plane target rack II-0202 will drive the plane target baffle II-0206 to open and close. The plane target installing seat II-0103 is provided with a sliding groove corresponding to the plane target baffle II-0206, and the plane target baffle is slidably connected to the plane target installing seat. The plane target II-0205 is fixed onto the target installing plate II-0204 through screws. The plane target right side plate II-0207 and the plane target left side plate II-0215 are disposed at two side surfaces of the target material installing plate II-0204. The plane target upper plate II-0209 is fixed above the target material installing plate II-0204. The plane target lower plate II-0216 is fixed under the target material installing plate II-0204. The plane target back plate II-0210 is disposed behind the plane target left side plate II-0215. The second cooling element, i.e., the cooling pipe II-0214 is fixed to the back side of the target material installing plate II-0204 through the U-shaped pipe clamp II-0213 to cool the plane target II-0205. Holes are formed in the upper and the lower portions of the plane target left side plate II-0215 for the cooling pipe II-0214 to pass through. The magnetic post installing seat II-0218 is fixed onto the sliding block of the linear module II-0219 through screws. The linear module is fixed onto the plane target installing seat. The magnetic post installing rod II-0217 is fixedly connected to the magnetic post installing seat II-0218. A groove is formed in the plane target lower plate II-0216, and the magnetic post installing rod II-0217 can slide in the groove of the plane target lower plate II-0216. The magnetic post II-0212 is fixedly connected to the magnetic post installing rod II-0217 through threads. The upper side of the magnetic post II-0212 is connected to the magnetic post roller II-0211 through threads. A groove is formed in the magnetic post sliding groove II-0208, and the magnetic post roller II-0211 can slide in the groove. The linear module II-0219 uses a lead screw transmission mechanism driven by a motor. The rotation of the motor of the lead screw transmission mechanism will drive the sliding block thereon to move, and at the same time, the sliding block drives the magnetic post II-0212 to move leftwards and rightwards through the magnetic post installing seat II-0218 and the magnetic post installing rod II-0217, such that a magnetic field in the coating cavity II-0101 is changed. The arc striking device II-0203 is disposed on an inner wall of the coating cavity II-0101, and initiates electric arc onto the plane target II-0205 for discharging beside the plane target.

Figure 35:
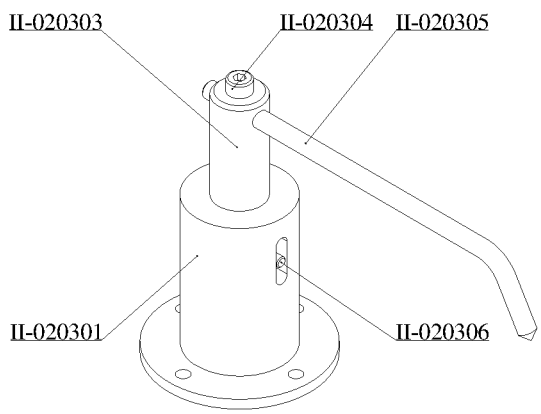
FIG. 35 is an axonometric diagram of an arc striking device in Embodiment 1 of the present invention.
Figure 36:
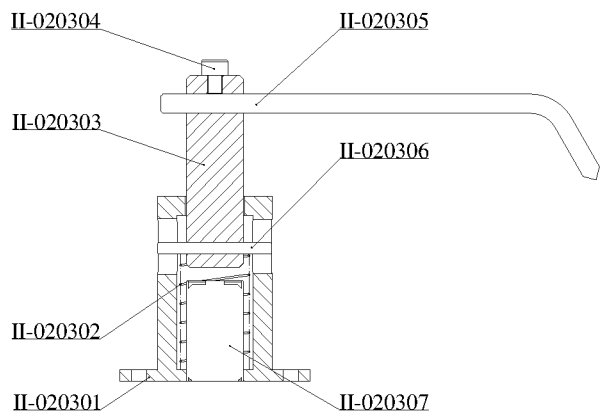
FIG. 36 is a cutaway view of the arc striking device in Embodiment 1 of the present invention.

As shown in FIG. 35 and FIG. 36, the arc striking device II-0203 consists of an arc striking device seat II-020301, a spring II-020302, a moving rod II-020303, a compression screw II-020304, an arc striking needle II-020305, a position limiting rod II-020306 and an electromagnet II-020307. The arc striking device seat II-020301 is disposed onto the coating cavity II-0101 through screws. The spring II-020302 and the electromagnet II-020307 are disposed in the arc striking device seat II-020301. A lower portion of the moving rod II-020303 is disposed in the arc striking arc device seat II-020301. A hole is formed in the lower side of the moving rod II-020303 to cooperate with the position limiting rod II-020306. A groove is formed in the upper portion of the arc striking device seat II-020301, and the arc striking needle II-020305 moves in the groove, realizing a position limiting effect on the movement of the moving rod II-020303. The upper side of the moving rod II-020303 is also provided with a hole for being connected to the arc striking needle II-020305. The top of the moving rod II-020303 is provided with threads, and the arc striking needle II-020305 is fixed through screws. The electromagnet II-020307 generates magnetism when being energized to attract the moving rod II-020303, the arc striking needle II-020305 is driven to move downwards, and a needle point of the arc striking needle II-020305 discharge when being in contact with the plane target II-0205.

When the electromagnet II-020307 is powered off and lose magnetism, the spring II-020302 generates upward acting force on the position limiting rod II-020306, the moving rod II-020303 ascends under the action of the spring II-020302, and the arc striking needle can move to a certain amplitude under the actions of the spring and the moving and continuously in contact with a target material. Therefore, the arc striking needle is prevented from being consolidated onto the target material.

Figure 37:
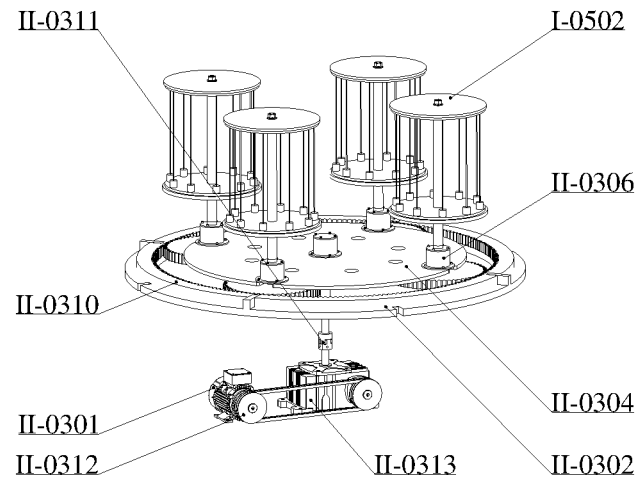
FIG. 37 is an axonometric diagram of a turntable assembly in Embodiment 1 of the present invention.
Figure 38:
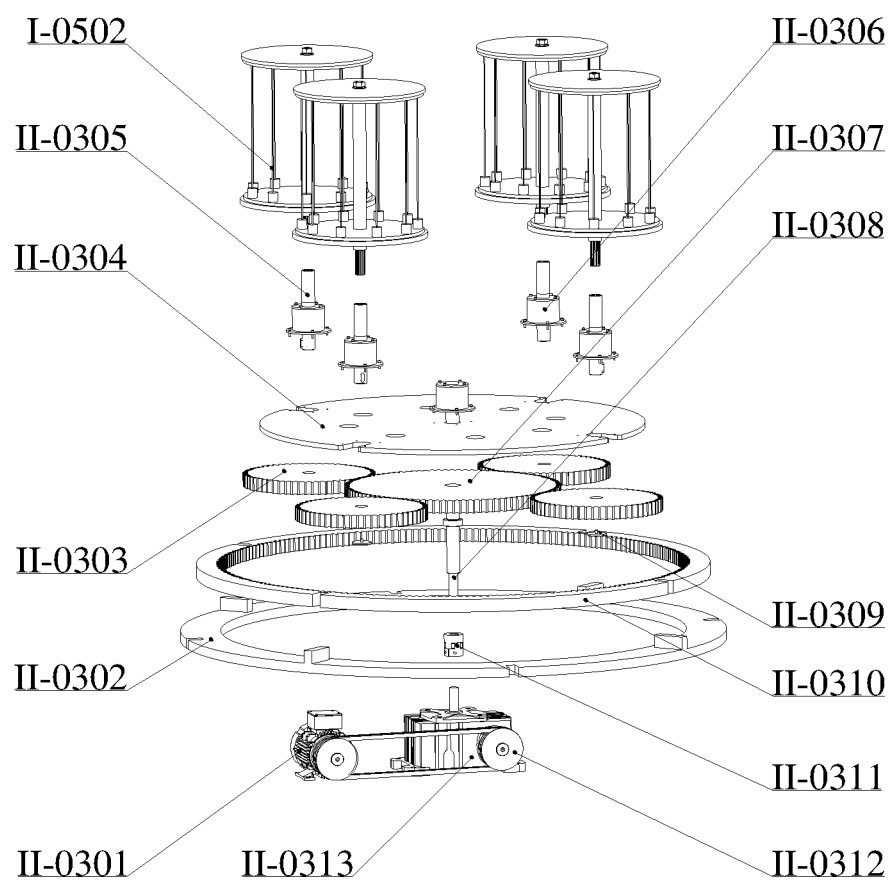
FIG. 38 is an exploded view of the turntable assembly in Embodiment 1 of the present invention.

As shown in FIG. 37 and FIG. 38, the turntable assembly II-03 consists of a rotating assembly motor II-0301, a gear ring fixing seat II-0302, a planet wheel II-0303, a big turntable II-0304, a rotating shaft II-0305, a rotating assembly II-0306, a sun wheel II-0307, a transmission rod II-0308, a gear shaft end retainer ring II-0309, a gear ring II-0310, a coupling II-0311, a pulley II-0312 and a rotating assembly speed reducer II-0313. The rotating assembly motor II-0301 and the rotating assembly speed reducer II-0313 are disposed on the ground. An output shaft of the rotating assembly motor II-0301 and an input shaft of the rotating assembly speed reducer II-0313 are each provided with the pulley II-0312. The pulley II-0312 is axially positioned relative to the shaft end retainer ring through a shaft shoulder. Power is transmitted through the belt between the rotating assembly motor II-0301 and the rotating assembly speed reducer II-0313. The elements such as the rotating assembly motor, the pulley, the rotating assembly speed reducer and the belt jointly form a sun wheel driving mechanism. The output shaft of the rotating assembly speed reducer II-0313 and the transmission rod II-0308 are connected through the coupling II-0311. The transmission rod II-0308 and the sun wheel II-0307 are connected through keys. Through the rotation of the transmission rod II-0308, the sun wheel II-0307 will be driven to rotate. The sun wheel II-0307 is meshed with four planet wheels II-0303 through teeth. At the same time, the four planet wheels II-0303 are meshed with the gear ring II-0310. A positioning groove is formed in the gear ring II-0310, the gear ring fixing seat II-0302 is provided with a positioning block corresponding to the positioning groove, and the gear ring II-0310 is thus fixed to the gear ring fixing seat II-0302. At the same time, the gear ring fixing seat II-0302 is also provided with a positioning groove, and can be disposed on the coating cavity II-0101. The rotating shaft II-0305 is fixed onto the big turntable II-0304 through screws. The lower side of the rotating shaft II-0305 is connected to the planet wheel II-0303 through keys, and is axially positioned through the gear shaft end retainer ring II-0309. The upper side of the rotating shaft II-0305 is connected to the tool fixture I-0502 through splines. When the planet wheel II-0303 rotates, a shaft in the rotating shaft II-0305 is driven to rotate through the key, and the rotating shaft II-0305 will drive the tool fixture I-0502 to rotate, such that the coating effect is optimized.

Figure 39:
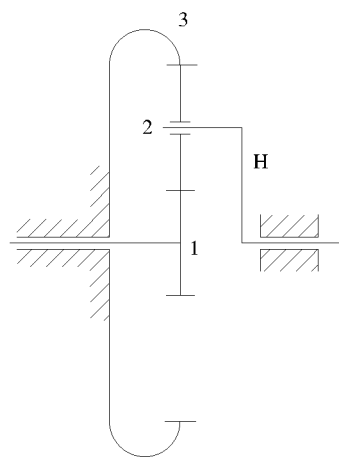
FIG. 39 is a cutaway view of the turntable assembly in Embodiment 1 of the present invention.

As shown in FIG. 39, a planet wheel system transmission ratio is as follows:

$$i_{1H} = \frac{z_3}{z_1} + 1. \tag{18}$$

Additionally, the planet wheel shall conform to eccentric conditions:

$$r_1 + r_2 = r_3 - r_2, \tag{19}$$

$$z_1 + z_2 = z_3 - z_2, \tag{20}$$

and $$z_2 = \frac{z_3 - z_1}{2} = \frac{(i_{1H} - 2)z_1}{2}. \tag{21}$$

Figure 40:
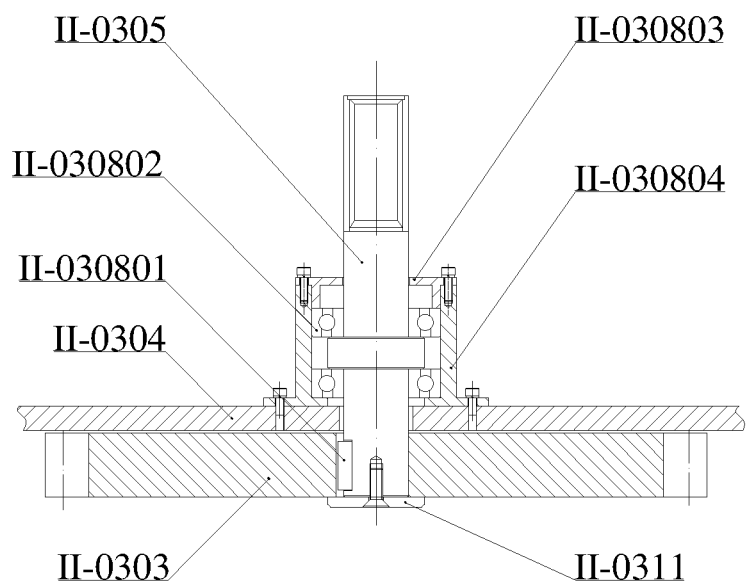
FIG. 40 is a principle diagram of a planet gear.

As shown in FIG. 40, the rotating assembly II-0306 consists of a flat key II-030601, an angular contact ball bearing II-030602, an end cover II-030603, and a bearing sleeve II-030604. The bearing sleeve II-030604 is fixed above the big turntable II-0304 through screws. The end cover II-030603 is fixed above the bearing sleeve II-030604 through screws. Two symmetrical angular contact ball bearings II-030602 are disposed in the bearing sleeve II-030604. The angular contact ball bearing II-030602 is axially positioned relative to the bearing sleeve II-030604 through a shaft shoulder of the rotating shaft II-0305 and the end cover II-030603. The upper side of the rotating shaft II-0305 is provided with an outer spline cooperatively connected to the inner spline of the fixture tray middle shaft. The rotating shaft I-0305 and the planet wheel I-030801 are connected and transmitted through keys. The planet wheel II-0303 is axially positioned through the gear shaft end retainer ring II-0309, and the gear shaft end retainer ring II-0309 is fixed onto the rotating shaft II-0305 through screws.

In the present embodiment, the sun wheel driving mechanism can drive the sun wheel to rotate. Under the meshed effect of the sun wheel and the planet wheel, the planet wheel can do revolution around the axial line of the sun wheel, i.e., the axial line of the coating chamber, and can also do rotation movement around its own axial line at the same time, and the tool fixture is further driven through the rotating assembly to do rotation movement during revolution. Therefore, the uniformity of the thickness of the tool coating is ensured, and the coating quality is improved.

Figure 41:
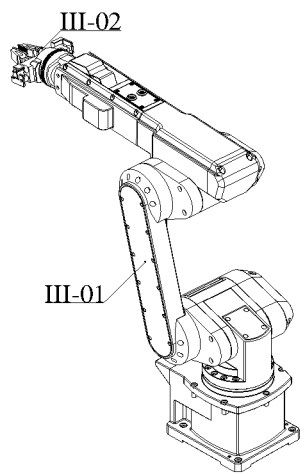
FIG. 41 is an axonometric diagram of a manipulator in Embodiment 1 of the present invention.

As shown in FIG. 41, the manipulator III consists of a loading and unloading manipulator III-01 and a vision detection device III-02. The loading and unloading manipulator III-01 is configured to clamp the workpiece cleaned and dried in the cleaning device I into the coating device II. The vision detection device III-02 is a detection device capable of positioning the workpiece, and can convert the workpiece position into a digital signal through vision image processing, informing the loading and unloading manipulator III-01 to execute.

Figure 42:
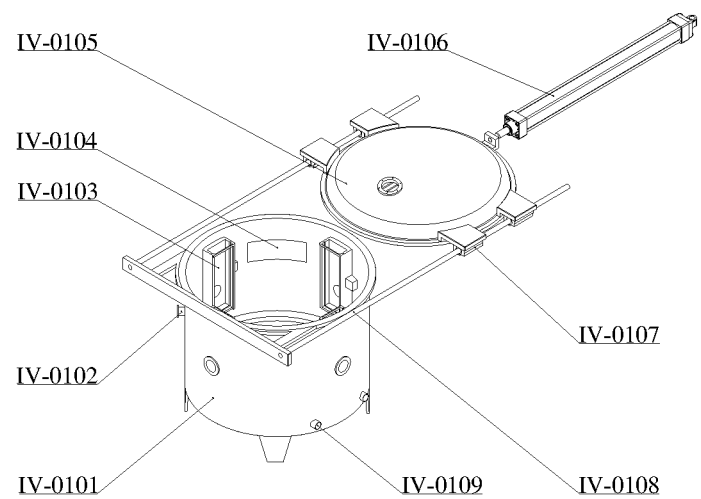
FIG. 42 is an axonometric diagram of another implementation of the coating chamber in Embodiment 1 of the present invention.

In another implementation of the coating device of the present embodiment, as shown in FIG. 42, the coating device consists of a coating chamber IV-0101, a gas port IV-0102, a plane target groove IV-0103, a vacuum pump connector IV-0104, a coating chamber cover IV-0105, a coating cover air cylinder IV-0106, a coating cover linear bearing IV-0107, a coating cover sliding shaft IV-0108 and a heater connector IV-0109. The coating chamber IV-0101 is a coating chamber II-01 in another form. The gas port IV-0102 is connected to a gas tank, and the gas required for coating enters the coating chamber through the gas port. The plane target grooves IV-0103 are fixed to the periphery of the inner wall of the coating chamber IV-0101 for installing the target material. The vacuum pump connector IV-0104 is connected to the vacuum pump, and the gas is extracted from the vacuum pump connector. Four coating cover linear bearings IV-0107 are fixed onto the coating chamber cover IV-0105 through screws. The coating cover linear bearing IV-0107 cooperates with the coating cover sliding shaft IV-0108, and can slide on the coating cover sliding shaft. The coating cover sliding shaft IV-0108 are fixed onto the coating chamber IV-0101. The top end of a piston rod of the coating cover air cylinder IV-0106 is fixedly connected to the coating chamber cover IV-0105, the coating chamber cover IV-0105 will be driven to move together when the piston rod of the coating cover air cylinder IV-0106 extends or retracts, realizing the opening and closing of the coating chamber cover IV-0105. The heater connector IV-0109 is configured to install a heating pipe.

Embodiment 2

The present embodiment discloses a working method of the carbide tool cleaning and coating production line in Embodiment 1:

A tool to be cleaned and coated is installed on the tool holding rod of the tool fixture in advance. The tool fixture is connected onto the tool fixture bracket, and is put onto the conveying mechanism. The lifting mechanism and the moving mechanism work to connect the elevating device execution assembly to the tool fixture bracket accommodating the tool fixture.

A leftward and rightward moving motor device works to drive the moving mechanism move on the support frame. When the moving mechanism moves to a position right above the high-pressure flushing pool, the lifting mechanism drives the tool fixture bracket for being put into the high-pressure flushing pool, thus flushing the tool with high-pressure water at a water pressure range of 0.3 Mpa to 0.8 Mpa. In the present embodiment, the water pressure of the high-pressure water is preferably 0.5 Mpa. After the flushing is completed, the lifting mechanism drives the tool fixture bracket to leave away from the high-pressure flushing pool, and the moving mechanism works. By using the same method, the tool fixture bracket is sequentially put into and taken away from the first ultrasonic cleaning pool, put into and taken away from the clean water rinsing pool, and put into and taken away from the second ultrasonic cleaning pool to rinse the tool. After the rinsing is completed, the moving mechanism and the lifting mechanism conveys the tool fixture bracket into the drying pool. Under the action of the drying machine, the tool is dried. After the drying is completed, the lifting mechanism and the moving mechanism cooperate with each other to move the tool fixture bracket to the conveying mechanism again. The manipulator gasps the tool fixture, so that the tool fixture leaves away from the tool fixture bracket, and the tool fixture is connected to the rotating shaft of the turntable assembly of the coating device through the inner spline, realizing the automatic transfer of the tool from the cleaning device and the coating device. After the tool fixture leaves away from the tool fixture bracket, the tool fixture bracket is transferred to an initial position by the conveying mechanism, and then another tool fixture is placed.

After the turntable assembly with the coating device is connected to the tool fixture, the coating cover is closed. Then, the coating chamber vacuumized by the vacuum pumping mechanism. After reaching a set negative pressure value, the gas is introduced into the coating chamber by using the gas tank. The heating pipe is switched on to reach a set temperature value, the plane target motor is used to drive the plane target baffle to move. The arc striking device is started to start to coat the tool. The sun wheel driving mechanism drives the sun wheel to rotate. Under the meshed effect of the sun wheel and the planet wheel, the tool fixture can do rotation around the axial line thereof during revolution around the sun wheel, and thus the uniformity of the coating is ensured. At the same time, the turntable assembly can be connected to a plurality of tool fixtures, so that the coating efficiency is improved. After the tool coating is completed, the plane target baffle blocks the plane target again to achieve a protective effect on the plane target.

The specific implementations of the present invention are described above with reference to the accompanying drawings, but are not intended to limit the protection scope of the present invention. A person skilled in the art should understand that various modifications or deformations may be made without creative efforts based on the technical solutions of the present invention, and such modifications or deformations shall fall within the protection scope of the present invention.

What is claimed is:

1. A carbide tool cleaning and coating production line, comprising a cleaning device and a coating device, wherein a manipulator is disposed between the cleaning device and the coating device;
   the cleaning device comprises a support frame, a cleaning mechanism and a drying mechanism are sequentially disposed under the support frame, the support frame is connected to a moving mechanism, the moving mechanism is connected to a lifting mechanism, the lifting mechanism is capable of being connected to a tool fixture bracket, and the tool fixture bracket is configured to accommodate tool fixtures; and
   the coating device comprises a coating chamber, a plane target mechanism is disposed in the coating chamber, a turntable assembly is also disposed in the coating chamber, the turntable assembly is capable of being connected to a plurality of tool fixtures, and each the tool fixture is capable of rotating around an axial line of the coating chamber under the driving of the turntable assembly, and rotating around an axial line of the tool fixture itself at the same time.

2. The carbide tool cleaning and coating production line according to claim 1, wherein a conveying mechanism is disposed on the outer periphery of the cleaning mechanism and the drying mechanism, and is capable of accommodating the tool fixture bracket.

3. The carbide tool cleaning and coating production line according to claim 1, wherein the cleaning mechanism comprises a flushing mechanism and a rinsing mechanism, the flushing mechanism uses a high-pressure flushing pool, the high-pressure flushing pool is capable of flushing a tool inside the high-pressure flushing pool with high-pressure water, the rinsing mechanism comprises a plurality of ultrasonic cleaning pools, a clean water rinsing pool is disposed between the adjacent ultrasonic cleaning pools, lifting elements capable of vertically moving are disposed in the ultrasonic cleaning pools and the clean water rinsing pools, and the lifting elements are connected to rinsing assemblies configured to drive the lifting elements for ascending and descending.

4. The carbide tool cleaning and coating production line according to claim 1, wherein the drying mechanism comprises a drying pool, a drying net is disposed in the drying pool, a heating element is disposed between the drying net and the drying pool, and the drying pool is also connected to an air inlet and an air outlet of a drying machine separately through pipelines.

5. The carbide tool cleaning and coating production line according to claim 1, wherein the top of the coating chamber is open, and is provided with a coating cover, through the coating cover, the coating chamber is capable of being opened and closed, and the coating cover is provided with a first cooling element.

6. The carbide tool cleaning and coating production line according to claim 1, wherein the coating chamber is connected to a vacuum pumping mechanism, the vacuum pumping mechanism is configured to vacuumize the inside of the coating chamber, the coating chamber is also connected to an inflating mechanism, and the inflating mechanism is configured to inflate the coating chamber with the gas of coating elements.

7. The carbide tool cleaning and coating production line according to claim 1, wherein the driving turntable assembly comprises a sun wheel, the sun wheel is meshed with a plurality of planet wheels, the planet wheels are meshed with a gear ring fixed in the coating chamber, the sun wheel is connected to a sun wheel driving mechanism, the planet wheel is connected to a planet wheel shaft disposed on a turntable, and the planet wheel shaft is capable of being fixedly connected to the tool fixture.

8. The carbide tool cleaning and coating production line according to claim 7, wherein the tool fixture comprises a lower tray and an upper top tray, the lower tray and the upper top tray are fixed through a fixture tray middle shaft disposed therebetween, a plurality of blade holding rods are disposed between the lower tray and the upper top tray, and each the blade holding rod is capable of being connected to a tool to be cleaned and coated, and the bottom end of the fixture tray middle shaft is capable of being fixedly connected to the planet wheel shaft.

9. The carbide tool cleaning and coating production line according to claim 5, wherein the plane target mechanism comprises a plane target, a plane target baffle and a second cooling element are respectively disposed at two sides of the plane target, the plane target baffle is capable of moving in a direction vertical to the axial line of the coating chamber to further expose the plane target, so that the plane target is capable of being in contact with an arc striking device fixedly disposed at the inner side surface of the coating chamber, and a magnetic post capable of moving in a direction vertical to the axial line of the coating chamber is disposed at one side of the second cooling element.

10. A working method of the carbide tool cleaning and coating production line according to claim 1, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

11. A working method of the carbide tool cleaning and coating production line according to claim 2, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

12. A working method of the carbide tool cleaning and coating production line according to claim 3, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

13. A working method of the carbide tool cleaning and coating production line according to claim 4, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

14. A working method of the carbide tool cleaning and coating production line according to claim 5, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

15. A working method of the carbide tool cleaning and coating production line according to claim 6, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

16. A working method of the carbide tool cleaning and coating production line according to claim 7, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

17. A working method of the carbide tool cleaning and coating production line according to claim 8, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

18. A working method of the carbide tool cleaning and coating production line according to claim 9, comprising: driving, by the moving mechanism, the lifting mechanism to move along the support frame; putting, by the lifting mechanism, the tool fixtures connected to the tools into the cleaning mechanism so as to clean the tool; after the cleaning is completed, taking out, by the lifting mechanism, the tool fixtures; driving, by the moving mechanism, the lifting mechanism to move; putting, by the lifting mechanism, the tool fixtures into the drying mechanism so as to dry the tools; conveying, by the manipulator, the dried tool fixtures into the coating chamber vacuumized, and connecting the tool fixtures to the turntable assembly; driving, by the turntable assembly, the tool fixtures to rotate around the axial line of the coating chamber; at the same time, driving, by the turntable assembly, each the tool fixture to rotate around the axial line of the tool fixture itself; and enabling the plane target mechanism to work so as to coat the tools.

\* \* \* \* \*